(12) United States Patent
Haddad et al.

(10) Patent No.: US 10,361,232 B2
(45) Date of Patent: Jul. 23, 2019

(54) PHOTOSENSITIVE IMAGING DEVICES AND ASSOCIATED METHODS

(71) Applicant: SiOnyx, LLC, Beverly, MA (US)

(72) Inventors: Homayoon Haddad, Beaverton, OR (US); Jeffrey McKee, Tualatin, OR (US); Jutao Jiang, Tigard, OR (US); Chintamani Palsule, Lake Oswego, OR (US); Leonard Forbes, Corvallis, OR (US)

(73) Assignee: SiOnyx, LLC, Beverly, MA (US)

( * ) Notice: Subject to any disclaimer, the term of this patent is extended or adjusted under 35 U.S.C. 154(b) by 0 days.

(21) Appl. No.: 15/614,269

(22) Filed: Jun. 5, 2017

(65) Prior Publication Data

US 2017/0271391 A1    Sep. 21, 2017

Related U.S. Application Data

(63) Continuation of application No. 13/770,897, filed on Feb. 19, 2013, now Pat. No. 9,673,243, which is a
(Continued)

(51) Int. Cl.
*H01L 27/148* (2006.01)
*H01L 27/146* (2006.01)
(Continued)

(52) U.S. Cl.
CPC .... *H01L 27/14629* (2013.01); *H01L 27/1461* (2013.01); *H01L 27/1462* (2013.01);
(Continued)

(58) Field of Classification Search
CPC ....... H01L 2924/00; H01L 2924/00014; H01L 27/14685; H01L 2224/73265;
(Continued)

(56) References Cited

U.S. PATENT DOCUMENTS 3,487,223 A    12/1969 St. John
3,922,571 A    11/1975 Smith
(Continued)

FOREIGN PATENT DOCUMENTS

AU    3666484    6/1985
CN    1507075    6/2004
(Continued)

OTHER PUBLICATIONS

A. Arndt, J.F. Allison, J.G. Haynos, and A. Meulenberg, Jr., "Optical Properties of the COMSAT Non-reflective Cell," 11th IEEE Photovoltaic Spec. Conf., p. 40, 1975.
(Continued)

*Primary Examiner* — Robert G Bachner
(74) *Attorney, Agent, or Firm* — Pepper Hamilton, LLP

(57) ABSTRACT

Backside illuminated photosensitive devices and associated methods are provided. In one aspect, for example, a backside-illuminated photosensitive imager device can include a semiconductor substrate having multiple doped regions forming a least one junction, a textured region coupled to the semiconductor substrate and positioned to interact with electromagnetic radiation, and a passivation region positioned between the textured region and the at least one junction. The passivation region is positioned to isolate the at least one junction from the textured region, and the semiconductor substrate and the textured region are positioned such that incoming electromagnetic radiation passes through the semiconductor substrate before contacting the textured region.
Additionally, the device includes an electrical transfer element coupled to the semiconductor substrate to transfer an electrical signal from the at least one junction.

17 Claims, 7 Drawing Sheets

Related U.S. Application Data continuation-in-part of application No. 13/050,557, filed on Mar. 17, 2011, now Pat. No. 8,476,681, which is a continuation-in-part of application No. 12/885,158, filed on Sep. 17, 2010, now Pat. No. 8,680,591.

(60) Provisional application No. 61/243,434, filed on Sep. 17, 2009, provisional application No. 61/311,004, filed on Mar. 5, 2010, provisional application No. 61/311,107, filed on Mar. 5, 2010, provisional application No. 61/443,988, filed on Feb. 17, 2011.

(51) Int. Cl.
  *H01L 31/0352* (2006.01)
  *H01L 31/0232* (2014.01)
  *H01L 31/0236* (2006.01)

(52) U.S. Cl.
  CPC .... *H01L 27/1464* (2013.01); *H01L 27/14623* (2013.01); *H01L 27/14625* (2013.01); *H01L 27/14645* (2013.01); *H01L 27/14685* (2013.01); *H01L 27/14689* (2013.01); *H01L 31/0232* (2013.01); *H01L 31/0236* (2013.01); *H01L 31/0352* (2013.01)

(58) Field of Classification Search
  CPC ......... H01L 27/14621; H01L 27/14627; H01L 2924/0002; H01L 2224/48227; H01L 27/14636; H01L 2224/48091; H01L 2924/00012; H01L 27/14625; H01L 2224/32225; H01L 27/14643; H01L 27/14645; H01L 27/14629; H01L 27/1464; H01L 27/1463; H01L 31/02327; H01L 2924/181; H01L 27/1462; H01L 27/14618; H01L 2224/97; H01L 27/14689; H01L 2224/48145; Y02E 10/50; Y02E 10/52; Y02E 10/547; Y02E 10/546; Y02E 10/548; Y02E 10/549; H04N 9/045; H04N 5/2254; H04N 5/378; H04N 5/2253; H04N 5/374; H04N 13/229; H04N 5/2257; H04N 5/33; H04N 5/3696; H04N 13/218; H04N 13/232; H04N 13/286; H04N 2209/042; H04N 2209/045; H04N 5/2173; H04N 5/2251; H04N 5/23212; H04N 5/332; H04N 5/335; H04N 5/3572; H04N 5/359; H04N 5/361; H04N 5/369; H04N 5/3745; H04N 5/37455; H04N 9/07
  See application file for complete search history.

(56) References Cited

U.S. PATENT DOCUMENTS

| | | |
|---|---|---|
| 3,973,994 A | 8/1976 | Redfield |
| 3,994,012 A | 11/1976 | Warner, Jr. |
| 4,017,887 A | 4/1977 | Davies et al. |
| 4,149,174 A | 4/1979 | Shannon |
| 4,176,365 A | 11/1979 | Kroger |
| 4,201,450 A | 5/1980 | Trapani |
| 4,242,149 A | 12/1980 | King et al. |
| 4,253,882 A | 3/1981 | Dalal |
| 4,277,793 A | 7/1981 | Webb |
| 4,322,571 A | 3/1982 | Stanbery |
| 4,419,533 A | 12/1983 | Czubatyj et al. |
| 4,452,826 A | 6/1984 | Shields et al. |
| 4,493,942 A | 1/1985 | Sheng et al. |
| 4,514,582 A | 4/1985 | Tiedje et al. |
| 4,536,608 A | 8/1985 | Sheng et al. |
| 4,568,960 A | 2/1986 | Petroff et al. |
| 4,593,303 A | 6/1986 | Dyck et al. |
| 4,593,313 A | 6/1986 | Nagasaki |
| 4,617,593 A | 10/1986 | Dudley |
| 4,630,082 A | 12/1986 | Sakai |
| 4,648,936 A | 3/1987 | Ashby et al. |
| 4,663,188 A | 5/1987 | Kane |
| 4,672,206 A | 6/1987 | Suzuki |
| 4,673,770 A | 6/1987 | Mandelkorn |
| 4,679,068 A | 7/1987 | Lillquist et al. |
| 4,751,571 A | 6/1988 | Lillquist |
| 4,775,425 A | 10/1988 | Guha et al. |
| 4,777,490 A | 10/1988 | Sharma et al. |
| 4,829,013 A | 5/1989 | Yamazaki |
| 4,883,962 A | 11/1989 | Elliott |
| 4,886,958 A | 12/1989 | Merryman et al. |
| 4,887,255 A | 12/1989 | Handa et al. |
| 4,894,526 A | 1/1990 | Bethea et al. |
| 4,910,568 A | 3/1990 | Taki et al. |
| 4,910,588 A | 3/1990 | Kinoshita et al. |
| 4,964,134 A | 10/1990 | Westbrook et al. |
| 4,965,784 A | 10/1990 | Land et al. |
| 4,968,372 A | 11/1990 | Maass |
| 4,999,308 A | 3/1991 | Nishiura et al. |
| 5,021,100 A | 6/1991 | Ishihara et al. |
| 5,021,854 A | 6/1991 | Huth |
| 5,080,725 A | 1/1992 | Green et al. |
| 5,081,049 A | 1/1992 | Green et al. |
| 5,100,478 A | 3/1992 | Kawabata |
| 5,101,260 A | 3/1992 | Nath |
| 5,114,876 A | 5/1992 | Weiner |
| 5,127,964 A | 7/1992 | Hamakawa et al. |
| 5,164,324 A | 11/1992 | Russell et al. |
| 5,208,822 A | 5/1993 | Haus et al. |
| 5,223,043 A | 6/1993 | Olson et al. |
| 5,234,790 A | 8/1993 | Lang et al. |
| 5,236,863 A | 8/1993 | Iranmanesh |
| 5,244,817 A | 9/1993 | Hawkins et al. |
| 5,296,045 A | 3/1994 | Banerjee et al. |
| 5,309,275 A | 5/1994 | Nishimura et al. |
| 5,322,988 A | 6/1994 | Russell et al. |
| 5,346,850 A | 9/1994 | Kaschmitter et al. |
| 5,351,446 A | 10/1994 | Langsdorf |
| 5,370,747 A | 12/1994 | Noguchi et al. |
| 5,373,182 A | 12/1994 | Norton |
| 5,381,431 A | 1/1995 | Zayhowski |
| 5,383,217 A | 1/1995 | Uemura |
| 5,390,201 A | 2/1995 | Tomono et al. |
| 5,410,168 A | 4/1995 | Hisa |
| 5,413,100 A | 5/1995 | Barthelemy et al. |
| 5,449,626 A | 9/1995 | Hezel |
| 5,454,347 A | 10/1995 | Shibata et al. |
| 5,502,329 A | 3/1996 | Pezzani |
| 5,523,570 A | 6/1996 | Hairston |
| 5,559,361 A | 9/1996 | Pezzani |
| 5,569,615 A | 10/1996 | Yamazaki et al. |
| 5,578,858 A | 11/1996 | Mueller et al. |
| 5,580,615 A | 12/1996 | Itoh et al. |
| 5,589,008 A | 12/1996 | Kepper |
| 5,589,704 A | 12/1996 | Levine |
| 5,597,621 A | 1/1997 | Hummel et al. |
| 5,600,130 A | 2/1997 | VanZeghbroeck |
| 5,626,687 A | 5/1997 | Campbell |
| 5,627,081 A | 5/1997 | Tsuo et al. |
| 5,635,089 A | 6/1997 | Singh et al. |
| 5,640,013 A | 6/1997 | Ishikawa et al. |
| 5,641,362 A | 6/1997 | Meier |
| 5,641,969 A | 6/1997 | Cooke et al. |
| 5,705,413 A | 1/1998 | Harkin et al. |
| 5,705,828 A | 1/1998 | Noguchi et al. |
| 5,708,486 A | 1/1998 | Miyawaki et al. |
| 5,710,442 A | 1/1998 | Watanabe et al. |
| 5,714,404 A | 2/1998 | Mititsky et al. |
| 5,727,096 A | 3/1998 | Ghirardi et al. |
| 5,731,213 A | 3/1998 | Ono |
| 5,751,005 A | 5/1998 | Wyles et al. |
| 5,758,644 A | 6/1998 | Diab et al. |
| 5,766,127 A | 6/1998 | Pologe et al. |
| 5,766,964 A | 6/1998 | Rohatgi et al. |
| 5,773,820 A | 6/1998 | Osajda et al. |
| 5,779,631 A | 7/1998 | Chance |

(56) References Cited

U.S. PATENT DOCUMENTS

| | | |
|---|---|---|
| 5,781,392 A | 7/1998 | Clark |
| 5,792,280 A | 8/1998 | Ruby et al. |
| 5,808,350 A | 9/1998 | Jack et al. |
| 5,859,446 A | 1/1999 | Nagasu et al. |
| 5,861,639 A | 1/1999 | Bernier |
| 5,923,071 A | 7/1999 | Saito |
| 5,935,320 A | 8/1999 | Graf et al. |
| 5,942,789 A | 8/1999 | Morikawa |
| 5,943,584 A | 8/1999 | Shim et al. |
| 5,963,790 A | 10/1999 | Matsuno et al. |
| 5,977,603 A | 11/1999 | Ishikawa |
| 6,071,796 A | 6/2000 | Voutsas |
| 6,072,117 A | 6/2000 | Matsuyama et al. |
| 6,080,988 A | 6/2000 | Ishizuya et al. |
| 6,082,858 A | 7/2000 | Grace et al. |
| 6,097,031 A | 8/2000 | Cole |
| 6,106,689 A | 8/2000 | Matsuyama |
| 6,107,618 A | 8/2000 | Fossum et al. |
| 6,111,300 A | 8/2000 | Cao et al. |
| 6,147,297 A | 11/2000 | Wettling et al. |
| 6,160,833 A | 12/2000 | Floyd et al. |
| 6,168,965 B1 | 1/2001 | Malinovich et al. |
| 6,194,722 B1 | 2/2001 | Fiorini et al. |
| 6,204,506 B1 | 3/2001 | Akahori et al. |
| 6,229,192 B1 | 5/2001 | Gu |
| 6,252,256 B1 | 6/2001 | Ugge et al. |
| 6,290,713 B1 | 9/2001 | Russell |
| 6,291,302 B1 | 9/2001 | Yu |
| 6,313,901 B1 | 11/2001 | Cacharelis |
| 6,320,296 B1 | 11/2001 | Fujii et al. |
| 6,327,022 B1 | 12/2001 | Nishi |
| 6,331,445 B1 | 12/2001 | Janz et al. |
| 6,331,885 B1 | 12/2001 | Nishi |
| 6,340,281 B1 | 1/2002 | Haraguchi |
| 6,372,591 B1 | 4/2002 | Mineji et al. |
| 6,372,611 B1 | 4/2002 | Horikawa |
| 6,379,979 B1 | 4/2002 | Connolly |
| 6,420,706 B1 | 7/2002 | Lurie et al. |
| 6,429,036 B1 | 8/2002 | Nixon et al. |
| 6,429,037 B1 | 8/2002 | Wenham et al. |
| 6,465,860 B2 | 10/2002 | Shigenaka et al. |
| 6,475,839 B2 | 11/2002 | Zhang et al. |
| 6,483,116 B1 | 11/2002 | Kozlowski et al. |
| 6,483,929 B1 | 11/2002 | Murakami et al. |
| 6,486,522 B1 | 11/2002 | Bishay et al. |
| 6,493,567 B1 | 12/2002 | Krivitski et al. |
| 6,498,336 B1 | 12/2002 | Tian et al. |
| 6,500,690 B1 | 12/2002 | Yamagishi et al. |
| 6,504,178 B2 | 1/2003 | Carlson et al. |
| 6,580,053 B1 | 6/2003 | Voutsas |
| 6,583,936 B1 | 6/2003 | Kaminsky et al. |
| 6,597,025 B2 | 7/2003 | Lauter et al. |
| 6,607,927 B2 | 8/2003 | Ramappa et al. |
| 6,624,049 B1 | 9/2003 | Yamazaki |
| 6,639,253 B2 | 10/2003 | Duane et al. |
| 6,667,528 B2 | 12/2003 | Cohen et al. |
| 6,677,655 B2 | 1/2004 | Fitzergald |
| 6,677,656 B2 * | 1/2004 | François ............ H01L 27/1443 257/225 |
| 6,683,326 B2 | 1/2004 | Iguchi et al. |
| 6,689,209 B2 | 2/2004 | Falster et al. |
| 6,753,585 B1 | 6/2004 | Kindt |
| 6,759,262 B2 | 7/2004 | Theil et al. |
| 6,790,701 B2 | 9/2004 | Shigenaka et al. |
| 6,800,541 B2 | 10/2004 | Okumura |
| 6,801,799 B2 | 10/2004 | Mendelson |
| 6,803,555 B1 | 10/2004 | Parrish et al. |
| 6,815,685 B2 | 11/2004 | Wany |
| 6,818,535 B2 | 11/2004 | Lu et al. |
| 6,822,313 B2 | 11/2004 | Matsushita |
| 6,825,057 B1 | 11/2004 | Heyers et al. |
| 6,864,156 B1 | 3/2005 | Conn |
| 6,864,190 B2 | 3/2005 | Han et al. |
| 6,867,806 B1 | 3/2005 | Lee et al. |
| 6,900,839 B1 | 5/2005 | Kozlowski et al. |
| 6,907,135 B2 | 6/2005 | Gifford et al. |
| 6,911,375 B2 | 6/2005 | Guarini et al. |
| 6,919,587 B2 | 7/2005 | Ballon et al. |
| 6,923,625 B2 | 8/2005 | Sparks |
| 6,927,432 B2 | 8/2005 | Holm et al. |
| 6,984,816 B2 | 1/2006 | Holm et al. |
| 7,008,854 B2 | 3/2006 | Forbes |
| 7,041,525 B2 | 5/2006 | Clevenger et al. |
| 7,057,256 B2 | 6/2006 | Carey, III et al. |
| 7,075,079 B2 | 7/2006 | Wood |
| 7,091,411 B2 | 8/2006 | Falk et al. |
| 7,109,517 B2 | 9/2006 | Zaidi |
| 7,126,212 B2 | 10/2006 | Enquist et al. |
| 7,132,724 B1 | 11/2006 | Merrill |
| 7,202,102 B2 | 4/2007 | Yao |
| 7,211,501 B2 | 5/2007 | Liu et al. |
| 7,235,812 B2 | 6/2007 | Chu et al. |
| 7,247,527 B2 | 7/2007 | Shimomura et al. |
| 7,247,812 B2 | 7/2007 | Tsao |
| 7,256,102 B2 | 8/2007 | Nakata et al. |
| 7,271,445 B2 | 9/2007 | Forbes |
| 7,271,835 B2 | 9/2007 | Iizuka et al. |
| 7,285,482 B2 | 10/2007 | Ochi |
| 7,314,832 B2 | 1/2008 | Kountz et al. |
| 7,354,792 B2 | 4/2008 | Carey, III et al. |
| 7,358,498 B2 | 4/2008 | Geng et al. |
| 7,375,378 B2 | 5/2008 | Manivannan et al. |
| 7,390,689 B2 | 6/2008 | Mazur et al. |
| 7,432,148 B2 | 10/2008 | Li et al. |
| 7,442,629 B2 | 10/2008 | Mazur et al. |
| 7,446,359 B2 | 11/2008 | Lee et al. |
| 7,446,807 B2 | 11/2008 | Hong |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Mazur et al. |
| 7,511,750 B2 | 3/2009 | Murakami |
| 7,521,737 B2 | 4/2009 | Augusto |
| 7,528,463 B2 | 5/2009 | Forbes |
| 7,542,085 B2 | 6/2009 | Altice, Jr. et al. |
| 7,547,616 B2 | 6/2009 | Fogel et al. |
| 7,551,059 B2 | 6/2009 | Farrier |
| 7,560,750 B2 | 7/2009 | Niira et al. |
| 7,564,631 B2 | 7/2009 | Li et al. |
| 7,582,515 B2 | 9/2009 | Choi et al. |
| 7,592,593 B2 | 9/2009 | Kauffman et al. |
| 7,595,213 B2 | 9/2009 | Kwon et al. |
| 7,605,397 B2 | 10/2009 | Kindem et al. |
| 7,615,808 B2 | 11/2009 | Pain et al. |
| 7,618,839 B2 | 11/2009 | Rhodes |
| 7,619,269 B2 | 11/2009 | Ohkawa |
| 7,629,582 B2 | 12/2009 | Hoffman et al. |
| 7,648,851 B2 | 1/2010 | Fu et al. |
| 7,649,156 B2 | 1/2010 | Lee |
| 7,705,879 B2 | 4/2010 | Kerr et al. |
| 7,731,665 B2 | 6/2010 | Lee et al. |
| 7,741,666 B2 | 6/2010 | Nozaki et al. |
| 7,745,901 B1 | 6/2010 | McCaffrey et al. |
| 7,763,913 B2 | 7/2010 | Fan et al. |
| 7,772,028 B2 | 8/2010 | Adkisson et al. |
| 7,781,856 B2 | 8/2010 | Mazur et al. |
| 7,800,192 B2 | 9/2010 | Venezia et al. |
| 7,800,684 B2 | 9/2010 | Tatani |
| 7,816,220 B2 | 10/2010 | Mazur et al. |
| 7,828,983 B2 | 11/2010 | Weber et al. |
| 7,847,253 B2 | 12/2010 | Carey et al. |
| 7,847,326 B2 | 12/2010 | Park et al. |
| 7,855,406 B2 | 12/2010 | Yamaguchi et al. |
| 7,875,498 B2 | 1/2011 | Elbanhawy et al. |
| 7,880,168 B2 | 2/2011 | Lenchenkov |
| 7,884,439 B2 | 2/2011 | Mazur et al. |
| 7,884,446 B2 | 2/2011 | Mazur et al. |
| 7,897,942 B1 | 3/2011 | Bereket |
| 7,910,964 B2 | 3/2011 | Kawahito et al. |
| 7,923,801 B2 | 4/2011 | Tian et al. |
| 7,968,834 B2 | 6/2011 | Veeder |
| 8,008,205 B2 | 8/2011 | Fukushima et al. |
| 8,013,411 B2 | 9/2011 | Cole |

(56) References Cited

U.S. PATENT DOCUMENTS

| | | | |
|---|---|---|---|
| 8,030,726 B2 | 10/2011 | Sumi | |
| 8,035,343 B2 | 10/2011 | Seman, Jr. | |
| 8,058,615 B2 | 11/2011 | McCaffrey | |
| 8,076,746 B2 | 12/2011 | McCarten et al. | |
| 8,080,467 B2 | 12/2011 | Carey et al. | |
| 8,088,219 B2 | 1/2012 | Knerer et al. | |
| 8,093,559 B1 | 1/2012 | Rajavel | |
| RE43,169 E | 2/2012 | Parker | |
| 8,164,126 B2 | 4/2012 | Moon et al. | |
| 8,207,051 B2 | 6/2012 | Sickler et al. | |
| 8,247,259 B2 | 8/2012 | Grolier et al. | |
| 8,259,293 B2 | 9/2012 | Andreou et al. | |
| 8,288,702 B2 | 10/2012 | Veeder | |
| 8,355,545 B2 | 1/2013 | Corcoran et al. | |
| 8,456,546 B2 | 6/2013 | Oike | |
| 8,470,619 B2 | 6/2013 | Bour | |
| 8,476,681 B2 | 7/2013 | Haddad et al. | |
| 8,564,087 B2 | 10/2013 | Yamamura et al. | |
| 8,603,902 B2 | 12/2013 | Mazer et al. | |
| 8,629,485 B2 | 1/2014 | Yamamura et al. | |
| 8,649,568 B2 | 2/2014 | Sato | |
| 8,680,591 B2 | 3/2014 | Haddad et al. | |
| 8,742,528 B2 | 6/2014 | Yamamura et al. | |
| 8,884,226 B2 | 11/2014 | Miyazaki et al. | |
| 8,906,670 B2 | 12/2014 | Gray | |
| 8,916,945 B2 | 12/2014 | Sakamoto et al. | |
| 8,994,135 B2 | 6/2015 | Yamamura et al. | |
| 9,184,204 B2 | 11/2015 | Hu | |
| 9,190,551 B2 | 11/2015 | Yamamura et al. | |
| 9,209,345 B2 | 12/2015 | Haddad | |
| 9,369,641 B2 | 6/2016 | Hu | |
| 9,419,159 B2 | 8/2016 | Sakamoto et al. | |
| 9,673,250 B2 | 6/2017 | Haddad | |
| 2001/0017344 A1 | 8/2001 | Aebi | |
| 2001/0022768 A1 | 9/2001 | Takahashi | |
| 2001/0044175 A1 | 11/2001 | Barret et al. | |
| 2001/0044266 A1 | 11/2001 | Katsuoka | |
| 2002/0020893 A1 | 2/2002 | Lhorte | |
| 2002/0024618 A1 | 2/2002 | Imai | |
| 2002/0056845 A1 | 5/2002 | Iguchi et al. | |
| 2002/0060322 A1 | 5/2002 | Tanabe et al. | |
| 2002/0079290 A1 | 6/2002 | Holdermann | |
| 2002/0117699 A1 | 8/2002 | Francois | |
| 2002/0148964 A1 | 10/2002 | Dausch et al. | |
| 2002/0182769 A1 | 12/2002 | Campbell | |
| 2003/0029495 A1* | 2/2003 | Mazur | H01L 31/0236 136/256 |
| 2003/0030083 A1 | 2/2003 | Lee et al. | |
| 2003/0045092 A1 | 3/2003 | Shin | |
| 2003/0057357 A1 | 3/2003 | Uppal et al. | |
| 2003/0111106 A1 | 6/2003 | Nagano et al. | |
| 2003/0210332 A1 | 11/2003 | Frame | |
| 2003/0213515 A1 | 11/2003 | Sano et al. | |
| 2003/0214595 A1 | 11/2003 | Mabuchi | |
| 2003/0228883 A1 | 12/2003 | Kusakari et al. | |
| 2004/0014307 A1 | 1/2004 | Shin et al. | |
| 2004/0016886 A1 | 1/2004 | Ringermacher et al. | |
| 2004/0041168 A1 | 3/2004 | Hembree et al. | |
| 2004/0046224 A1 | 3/2004 | Rossel et al. | |
| 2004/0077117 A1 | 4/2004 | Ding et al. | |
| 2004/0080638 A1 | 4/2004 | Lee | |
| 2004/0112426 A1 | 6/2004 | Hagino | |
| 2004/0130020 A1 | 7/2004 | Kuwabara et al. | |
| 2004/0161868 A1 | 8/2004 | Hong | |
| 2004/0222187 A1 | 11/2004 | Lin | |
| 2004/0252931 A1 | 12/2004 | Belleville et al. | |
| 2004/0256561 A1 | 12/2004 | Beuhler et al. | |
| 2005/0040440 A1 | 2/2005 | Murakami | |
| 2005/0051822 A1 | 3/2005 | Manning | |
| 2005/0062041 A1 | 3/2005 | Terakawa et al. | |
| 2005/0063566 A1 | 3/2005 | Beek et al. | |
| 2005/0088634 A1 | 4/2005 | Kosugi | |
| 2005/0093100 A1 | 5/2005 | Chen et al. | |
| 2005/0101100 A1 | 5/2005 | Kretchmer et al. | |
| 2005/0101160 A1 | 5/2005 | Garg et al. | |
| 2005/0127401 A1 | 6/2005 | Mazur et al. | |
| 2005/0134698 A1 | 6/2005 | Schroeder et al. | |
| 2005/0150542 A1 | 7/2005 | Madan | |
| 2005/0158969 A1 | 7/2005 | Binnis et al. | |
| 2005/0211996 A1 | 9/2005 | Krishna et al. | |
| 2005/0227390 A1 | 10/2005 | Shtein et al. | |
| 2006/0006482 A1 | 1/2006 | Rieve et al. | |
| 2006/0011954 A1 | 1/2006 | Ueda et al. | |
| 2006/0011955 A1 | 1/2006 | Baggenstoss | |
| 2006/0060848 A1 | 3/2006 | Chang et al. | |
| 2006/0071254 A1 | 4/2006 | Rhodes | |
| 2006/0079062 A1 | 4/2006 | Mazur et al. | |
| 2006/0086956 A1 | 4/2006 | Furukawa et al. | |
| 2006/0097172 A1 | 5/2006 | Park | |
| 2006/0097290 A1 | 5/2006 | Hietanen | |
| 2006/0118781 A1 | 6/2006 | Rhodes | |
| 2006/0121680 A1 | 6/2006 | Tanaka | |
| 2006/0128087 A1 | 6/2006 | Bamji et al. | |
| 2006/0132633 A1 | 6/2006 | Nam et al. | |
| 2006/0138396 A1 | 6/2006 | Lin et al. | |
| 2006/0145148 A1 | 7/2006 | Hirai et al. | |
| 2006/0145176 A1 | 7/2006 | Lee | |
| 2006/0160343 A1 | 7/2006 | Chong et al. | |
| 2006/0166475 A1 | 7/2006 | Mantl | |
| 2006/0175529 A1 | 8/2006 | Harmon et al. | |
| 2006/0180885 A1 | 8/2006 | Rhodes | |
| 2006/0181627 A1 | 8/2006 | Farrier | |
| 2006/0210122 A1 | 9/2006 | Cleveland | |
| 2006/0214121 A1 | 9/2006 | Schrey et al. | |
| 2006/0228897 A1 | 10/2006 | Timans | |
| 2006/0231914 A1 | 10/2006 | Carey et al. | |
| 2006/0238632 A1 | 10/2006 | Shah | |
| 2006/0244090 A1 | 11/2006 | Roy et al. | |
| 2006/0255340 A1 | 11/2006 | Manivannan et al. | |
| 2006/0257140 A1 | 11/2006 | Seger | |
| 2007/0035849 A1* | 2/2007 | Li | G02B 3/0012 359/652 |
| 2007/0035879 A1 | 2/2007 | Hall et al. | |
| 2007/0051876 A1 | 3/2007 | Sumi et al. | |
| 2007/0052050 A1 | 3/2007 | Dierickx | |
| 2007/0063219 A1 | 3/2007 | Sa'ar et al. | |
| 2007/0076481 A1 | 4/2007 | Tennant | |
| 2007/0103580 A1 | 5/2007 | Noto | |
| 2007/0115554 A1 | 5/2007 | Breitung et al. | |
| 2007/0123005 A1 | 5/2007 | Hiura et al. | |
| 2007/0125951 A1 | 6/2007 | Snider et al. | |
| 2007/0138590 A1 | 6/2007 | Wells et al. | |
| 2007/0145505 A1 | 6/2007 | Kim et al. | |
| 2007/0178672 A1 | 8/2007 | Tanaka et al. | |
| 2007/0187670 A1 | 8/2007 | Hsu et al. | |
| 2007/0189583 A1 | 8/2007 | Shimada et al. | |
| 2007/0194356 A1 | 8/2007 | Moon et al. | |
| 2007/0194401 A1 | 8/2007 | Nagai et al. | |
| 2007/0195056 A1 | 8/2007 | Lloyd | |
| 2007/0200940 A1 | 8/2007 | Gruhlke et al. | |
| 2007/0201859 A1 | 8/2007 | Sarrat | |
| 2007/0235827 A1 | 10/2007 | Altice | |
| 2007/0237504 A1 | 10/2007 | Nakashiba | |
| 2007/0247414 A1 | 10/2007 | Roberts | |
| 2007/0262366 A1 | 11/2007 | Baek et al. | |
| 2007/0290283 A1 | 12/2007 | Park et al. | |
| 2007/0296060 A1 | 12/2007 | Tanabe et al. | |
| 2007/0298533 A1 | 12/2007 | Yang et al. | |
| 2008/0002863 A1 | 1/2008 | Northcott | |
| 2008/0020555 A1 | 1/2008 | Shimomura et al. | |
| 2008/0026550 A1 | 1/2008 | Werner et al. | |
| 2008/0036022 A1 | 2/2008 | Hwang et al. | |
| 2008/0044943 A1 | 2/2008 | Mazur et al. | |
| 2008/0076240 A1 | 3/2008 | Veschetti et al. | |
| 2008/0099804 A1 | 5/2008 | Venezia | |
| 2008/0121280 A1 | 5/2008 | Carnel et al. | |
| 2008/0121805 A1 | 5/2008 | Tweet et al. | |
| 2008/0142686 A1 | 6/2008 | Konno et al. | |
| 2008/0158398 A1 | 7/2008 | Yaffe et al. | |
| 2008/0170173 A1 | 7/2008 | Park et al. | |
| 2008/0173620 A1 | 7/2008 | Grek | |
| 2008/0174685 A1 | 7/2008 | Shan et al. | |
| 2008/0178932 A1 | 7/2008 | Den Boer et al. | |
| 2008/0179762 A1 | 7/2008 | Cho et al. | |

(56) References Cited

U.S. PATENT DOCUMENTS

| | | |
|---|---|---|
| 2008/0191310 A1 | 8/2008 | Wu et al. |
| 2008/0192132 A1 | 8/2008 | Bechtel et al. |
| 2008/0192133 A1 | 8/2008 | Abiru et al. |
| 2008/0196761 A1 | 8/2008 | Nakano et al. |
| 2008/0198251 A1 | 8/2008 | Xu et al. |
| 2008/0202576 A1 | 8/2008 | Hieslmair |
| 2008/0213936 A1 | 9/2008 | Hatai |
| 2008/0223436 A1 | 9/2008 | den Boer et al. |
| 2008/0242005 A1 | 10/2008 | Dozen et al. |
| 2008/0251812 A1 | 10/2008 | Yoo |
| 2008/0257409 A1 | 10/2008 | Li et al. |
| 2008/0258604 A1 | 10/2008 | Mazur et al. |
| 2008/0266434 A1 | 10/2008 | Sugawa et al. |
| 2008/0266435 A1 | 10/2008 | Agranov et al. |
| 2008/0281174 A1 | 11/2008 | Dietiker |
| 2008/0284884 A1 | 11/2008 | Makino et al. |
| 2008/0309913 A1 | 12/2008 | Fallon |
| 2009/0002528 A1 | 1/2009 | Manabe et al. |
| 2009/0009596 A1 | 1/2009 | Kerr et al. |
| 2009/0014056 A1 | 1/2009 | Hockaday |
| 2009/0027640 A1 | 1/2009 | Shibazaki |
| 2009/0036783 A1 | 2/2009 | Kishima |
| 2009/0038669 A1 | 2/2009 | Atanackovic |
| 2009/0039397 A1 | 2/2009 | Chao |
| 2009/0050944 A1 | 2/2009 | Hong |
| 2009/0056797 A1 | 3/2009 | Barnett et al. |
| 2009/0057536 A1 | 3/2009 | Hirose |
| 2009/0065051 A1 | 3/2009 | Chan et al. |
| 2009/0078316 A1 | 3/2009 | Khazeni et al. |
| 2009/0095887 A1 | 4/2009 | Saveliev |
| 2009/0101197 A1 | 4/2009 | Morikawa |
| 2009/0109305 A1 | 4/2009 | Dai et al. |
| 2009/0114630 A1 | 5/2009 | Hawryluk |
| 2009/0142879 A1 | 6/2009 | Isaka et al. |
| 2009/0146240 A1 | 6/2009 | Carey et al. |
| 2009/0160983 A1 | 6/2009 | Lenchenkov |
| 2009/0174026 A1 | 7/2009 | Carey et al. |
| 2009/0180010 A1 | 7/2009 | Adikisson et al. |
| 2009/0194671 A1 | 8/2009 | Nozaki et al. |
| 2009/0200454 A1 | 8/2009 | Barbier et al. |
| 2009/0200586 A1 | 8/2009 | Mao et al. |
| 2009/0200626 A1 | 8/2009 | Qian et al. |
| 2009/0200631 A1 | 8/2009 | Tai et al. |
| 2009/0206237 A1 | 8/2009 | Shannon et al. |
| 2009/0211627 A1 | 8/2009 | Meier et al. |
| 2009/0213883 A1 | 8/2009 | Mazur et al. |
| 2009/0218493 A1 | 9/2009 | McCaffrey et al. |
| 2009/0223561 A1 | 9/2009 | Kim et al. |
| 2009/0227061 A1 | 9/2009 | Bateman et al. |
| 2009/0242019 A1 | 10/2009 | Ramamoorthy et al. |
| 2009/0242032 A1 | 10/2009 | Yamazaki et al. |
| 2009/0242933 A1 | 10/2009 | Hu et al. |
| 2009/0256156 A1 | 10/2009 | Hsieh |
| 2009/0256226 A1 | 10/2009 | Tatani |
| 2009/0261255 A1 | 10/2009 | Nakamura et al. |
| 2009/0273695 A1 | 11/2009 | Mabuchi |
| 2009/0283807 A1 | 11/2009 | Adkisson et al. |
| 2009/0294787 A1 | 12/2009 | Nakaji et al. |
| 2009/0308450 A1 | 12/2009 | Adibi et al. |
| 2009/0308457 A1 | 12/2009 | Smith et al. |
| 2010/0000597 A1 | 1/2010 | Cousins |
| 2010/0013036 A1 | 1/2010 | Carey |
| 2010/0013039 A1 | 1/2010 | Qian et al. |
| 2010/0013593 A1 | 1/2010 | Luckhardt |
| 2010/0024871 A1 | 2/2010 | Oh et al. |
| 2010/0032008 A1 | 2/2010 | Adekore |
| 2010/0037952 A1 | 2/2010 | Lin |
| 2010/0038523 A1 | 2/2010 | Venezia et al. |
| 2010/0038542 A1 | 2/2010 | Carey et al. |
| 2010/0040981 A1 | 2/2010 | Kiesel et al. |
| 2010/0044552 A1 | 2/2010 | Chen |
| 2010/0051809 A1 | 3/2010 | Onat et al. |
| 2010/0052088 A1 | 3/2010 | Carey |
| 2010/0053382 A1 | 3/2010 | Kuniba |
| 2010/0055887 A1 | 3/2010 | Piwczyk |
| 2010/0059385 A1 | 3/2010 | Li |
| 2010/0059803 A1 | 3/2010 | Gidon et al. |
| 2010/0072349 A1 | 3/2010 | Veeder |
| 2010/0074396 A1 | 3/2010 | Schmand et al. |
| 2010/0083997 A1 | 4/2010 | Hovel |
| 2010/0084009 A1 | 4/2010 | Carlson et al. |
| 2010/0096718 A1 | 4/2010 | Hynecek et al. |
| 2010/0097609 A1 | 4/2010 | Jaeger et al. |
| 2010/0102206 A1 | 4/2010 | Cazaux et al. |
| 2010/0102366 A1 | 4/2010 | Lee et al. |
| 2010/0109060 A1 | 5/2010 | Mao et al. |
| 2010/0116312 A1 | 5/2010 | Peumans et al. |
| 2010/0117181 A1 | 5/2010 | Kim et al. |
| 2010/0118172 A1 | 5/2010 | McCarten et al. |
| 2010/0128937 A1 | 5/2010 | Yoo et al. |
| 2010/0133635 A1 | 6/2010 | Lee et al. |
| 2010/0140733 A1 | 6/2010 | Lee et al. |
| 2010/0140768 A1 | 6/2010 | Zafiropoulo |
| 2010/0143744 A1 | 6/2010 | Gupta |
| 2010/0147383 A1 | 6/2010 | Carey et al. |
| 2010/0200658 A1 | 8/2010 | Olmstead et al. |
| 2010/0219506 A1 | 9/2010 | Gupta |
| 2010/0224229 A1 | 9/2010 | Pralle et al. |
| 2010/0240169 A1 | 9/2010 | Petti et al. |
| 2010/0245647 A1 | 9/2010 | Honda et al. |
| 2010/0258176 A1 | 10/2010 | Kang et al. |
| 2010/0264473 A1 | 10/2010 | Adkisson et al. |
| 2010/0289885 A1 | 11/2010 | Lu et al. |
| 2010/0290668 A1 | 11/2010 | Friedman et al. |
| 2010/0300505 A1 | 12/2010 | Chen |
| 2010/0300507 A1 | 12/2010 | Heng et al. |
| 2010/0313932 A1 | 12/2010 | Kroll et al. |
| 2011/0003424 A1 | 1/2011 | De Ceuster et al. |
| 2011/0019050 A1 | 1/2011 | Yamashita |
| 2011/0025842 A1 | 2/2011 | King et al. |
| 2011/0056544 A1 | 3/2011 | Ji et al. |
| 2011/0073976 A1 | 3/2011 | Vaillant |
| 2011/0095387 A1 | 4/2011 | Carey et al. |
| 2011/0104850 A1 | 5/2011 | Weidman et al. |
| 2011/0127567 A1 | 6/2011 | Seong |
| 2011/0140221 A1 | 6/2011 | Venezia et al. |
| 2011/0150304 A1 | 6/2011 | Abe et al. |
| 2011/0194100 A1 | 8/2011 | Thiel et al. |
| 2011/0220971 A1 | 9/2011 | Haddad |
| 2011/0227138 A1 | 9/2011 | Haddad |
| 2011/0251478 A1 | 10/2011 | Wieczorek |
| 2011/0260059 A1 | 10/2011 | Jiang et al. |
| 2011/0266644 A1 | 11/2011 | Yamamura et al. |
| 2011/0292380 A1 | 12/2011 | Bamji |
| 2011/0303999 A1 | 12/2011 | Sakamoto et al. |
| 2012/0001841 A1 | 1/2012 | Gokingco et al. |
| 2012/0024363 A1 | 2/2012 | Dimer et al. |
| 2012/0024364 A1 | 2/2012 | Carey, III et al. |
| 2012/0038811 A1 | 2/2012 | Ellis-monaghan et al. |
| 2012/0043637 A1 | 2/2012 | King et al. |
| 2012/0049242 A1 | 3/2012 | Atanackovic et al. |
| 2012/0056289 A1* | 3/2012 | Tian ............ H01L 27/14603 257/431 |
| 2012/0080733 A1 | 4/2012 | Doan et al. |
| 2012/0111396 A1 | 5/2012 | Saylor et al. |
| 2012/0171804 A1 | 7/2012 | Moslehi et al. |
| 2012/0187190 A1 | 7/2012 | Wang et al. |
| 2012/0222396 A1 | 9/2012 | Clemen |
| 2012/0274744 A1 | 11/2012 | Wan |
| 2012/0291859 A1 | 11/2012 | Vineis et al. |
| 2012/0300037 A1 | 11/2012 | Laudo |
| 2012/0305063 A1 | 12/2012 | Moslehi et al. |
| 2012/0312304 A1 | 12/2012 | Lynch et al. |
| 2012/0313204 A1 | 12/2012 | Haddad et al. |
| 2012/0313205 A1 | 12/2012 | Haddad et al. |
| 2012/0326008 A1 | 12/2012 | Mckee et al. |
| 2013/0001553 A1 | 1/2013 | Vineis et al. |
| 2013/0082343 A1 | 4/2013 | Fudaba et al. |
| 2013/0135439 A1 | 5/2013 | Kakuko et al. |
| 2013/0168792 A1 | 7/2013 | Haddad et al. |
| 2013/0168803 A1 | 7/2013 | Haddad et al. |
| 2013/0200251 A1 | 8/2013 | Velichko |
| 2013/0207214 A1 | 8/2013 | Haddad et al. |
| 2013/0285130 A1 | 10/2013 | Ting |

(56) References Cited

U.S. PATENT DOCUMENTS

| | | | |
|---|---|---|---|
| 2014/0198240 | A1 | 7/2014 | Rhoads |
| 2014/0247378 | A1 | 9/2014 | Sharma et al. |
| 2014/0352779 | A1 | 12/2014 | Smirnov et al. |
| 2015/0076468 | A1 | 3/2015 | Yamaguchi et al. |

FOREIGN PATENT DOCUMENTS

| | | |
|---|---|---|
| CN | 1614789 | 5/2005 |
| CN | 101404307 | 4/2009 |
| CN | 101423942 | 5/2009 |
| CN | 101478013 | 7/2009 |
| CN | 101634026 | 1/2010 |
| CN | 101634027 | 1/2010 |
| CN | 101818348 | 9/2010 |
| DE | 19838439 | 4/2000 |
| EP | 0473439 | 3/1992 |
| EP | 0566156 | 10/1993 |
| EP | 1630871 | 1/2006 |
| EP | 1873840 | 1/2008 |
| EP | 2073270 | 5/2012 |
| EP | 2509107 | 10/2012 |
| FR | 2827707 | 1/2003 |
| GB | 2030766 | 4/1980 |
| JP | S5771188 | 5/1982 |
| JP | S57173966 | 10/1982 |
| JP | S63116421 | 5/1988 |
| JP | H02152226 | 6/1990 |
| JP | H02237026 | 9/1990 |
| JP | H03183037 | 8/1991 |
| JP | H04318970 | 11/1992 |
| JP | H06104414 | 4/1994 |
| JP | H06244444 | 9/1994 |
| JP | H06267868 | 9/1994 |
| JP | H06275641 | 9/1994 |
| JP | H0774240 | 3/1995 |
| JP | H07235658 | 5/1995 |
| JP | H07183484 | 7/1995 |
| JP | 9148594 | 6/1997 |
| JP | H09298308 | 11/1997 |
| JP | 11077348 | 3/1999 |
| JP | 11097724 | 4/1999 |
| JP | 2000164914 | 6/2000 |
| JP | 2001007381 | 1/2001 |
| JP | 2001024936 | 1/2001 |
| JP | 2001189478 | 7/2001 |
| JP | 2001257927 | 9/2001 |
| JP | 2001339057 | 12/2001 |
| JP | 2002043594 | 2/2002 |
| JP | 2002134640 | 5/2002 |
| JP | 2003058269 | 2/2003 |
| JP | 2003104121 | 4/2003 |
| JP | 2003163360 | 6/2003 |
| JP | 2003242125 | 8/2003 |
| JP | 2003258285 | 9/2003 |
| JP | 2003308130 | 10/2003 |
| JP | 2004047042 | 2/2004 |
| JP | 2004273886 | 9/2004 |
| JP | 2004273887 | 9/2004 |
| JP | 2005339425 | 12/2005 |
| JP | 2006033493 | 2/2006 |
| JP | 2006147991 | 6/2006 |
| JP | 2006173381 | 6/2006 |
| JP | 2006210701 | 8/2006 |
| JP | 2006255430 | 9/2006 |
| JP | 2006261372 | 9/2006 |
| JP | 2007122237 | 5/2007 |
| JP | 2007165909 | 6/2007 |
| JP | 2007180642 | 7/2007 |
| JP | 2007180643 | 7/2007 |
| JP | 2008099158 | 4/2008 |
| JP | 2008167004 | 7/2008 |
| JP | 2008187003 | 8/2008 |
| JP | 2008283219 | 11/2008 |
| JP | 2008294698 | 12/2008 |
| JP | 2009021479 | 1/2009 |
| JP | 2009152569 | 7/2009 |
| JP | 2009253683 | 10/2009 |
| JP | 2010278472 | 12/2010 |
| JP | 2011091128 | 5/2011 |
| JP | 2012212349 | 11/2012 |
| KR | 20010061058 | 4/2001 |
| KR | 2005509243 | 4/2005 |
| KR | 100825808 | 4/2008 |
| KR | 20090077274 | 7/2009 |
| KR | 20100026463 | 3/2010 |
| KR | 20100118864 | 11/2010 |
| KR | 20060052278 | 5/2016 |
| TW | 200627675 | 8/2006 |
| TW | 200818529 | 4/2008 |
| WO | WO 91/14284 | 9/1991 |
| WO | WO 2000031679 | 6/2000 |
| WO | WO 2002041363 | 5/2002 |
| WO | WO 03/059390 | 7/2003 |
| WO | WO 2006/086014 | 8/2006 |
| WO | WO 2008091242 | 7/2008 |
| WO | WO 2008099524 | 8/2008 |
| WO | WO 2008145097 | 12/2008 |
| WO | WO 2009016846 | 2/2009 |
| WO | WO 2009100023 | 8/2009 |
| WO | WO 2009147085 | 12/2009 |
| WO | WO 2010033127 | 3/2010 |
| WO | WO 2011003871 | 1/2011 |
| WO | WO 2011035188 | 3/2011 |
| WO | WO 2011119618 | 3/2011 |
| WO | WO 2012027290 | 3/2012 |
| WO | WO 2012174752 | 12/2012 |

OTHER PUBLICATIONS

Asom et al., Interstitial Defect Reactions in Silicon; Appl. Phys. Lett.; Jul. 27, 1987; pp. 256-258; vol. 51(4); American Institute of Physics.

Berger, Michael; Moth Eyes Inspire Self-Cleaning Antireflection Nanotechnology Coatings; 2008; 3 pages; Nanowerk LLC.

Berger, O., Inns, D. and Aberle, A.E. "Commercial White Paint as Back Surface Reflector for Thin-Film Solar Cells", Solar Energy Materials & Solar Cells, vol. 91, pp. 1215-1221,2007.

Bernhard, C.G., "Structural and Functional Adaptation in a Visual System" Endevor vol. 26, pp. 79-84, May 1967.

Betta et al.; Si-PIN X-Ray Detector Technology; Nuclear Instruments and Methods in Physics Research; 1997; pp. 344-348; vol. A, No. 395; Elsevier Science B.V.

Boden, S.A. et al.; Nanoimprinting for Antireflective Moth-Eye Surfaces; 4 pages; 2008.

Bogue: "From bolometers to beetles: the development of the thermal imaging sensors;" sensor Review; 2007; pp. 278-281; Emerald Group Publishing Limited (ISSN 0260-2288).

Borghesi et al.; "Oxygen Precipitation in Silicon," J. Appl. Phys., v. 77(9), pp. 4169-4244 (May 1, 1995).

Born, M. and E.Wolf, "Princip les of Optics, 7th Ed.", Cambridge University Press, 1999, pp. 246-255.

Brieger,S., O.Dubbers, S.Fricker, A.Manzke, C.Pfahler, A.Plettl, and P.Zlemann, "An Approach for the Fabrication of Hexagonally Ordered Arrays of Cylindrical Nanoholes in Crystalline and Amorphous Silicon Based on the Self-Organization of Polymer Micelles", Nanotechnology, vol. 17, pp. 4991-4994, 2006, doi:10.1088/0957-4884/17/19/036.

Buttgen, B.; "Demodulation Pixel Based on Static Drift Fields"; IEEE Transactions on Electron Devices, vol. 53, No. 11, Nov. 2006.

Campbell, Stephen A., "The Science and Engineering of Microeletronic Fabrication, 2nd Ed.", Oxford University Press, 2001, pp. 406-411.

Carey, P.G. et al., "In-situ Doping of Silicon Using Gas Immersion Laser Doping (GILD) Process," Appl. Surf. Sci. 43, 325-332 (1989).

Carey et al., "Femtosecond-Laser-Assisted Microstructuring of Silicon Surfaces", Optics and Photonics News, 2003. 14, 32-36.

Carey, et al. "Femtosecond Laser-Assisted Microstructuring of Silicon for Novel Detector, Sensing and Display Technologies", LEOS 2003, 481-482, Tuscon, AR.

(56) References Cited

OTHER PUBLICATIONS

Carey, et al. "Femtosecond Laser-Assisted Microstructuring of Silicon for Novel Detector, Sensing and Display Technologies", LEOS; 2002, 97-98, Glasgos, Scotland, 2002.
Carey, et al., "Fabrication of Micrometer-Sized Conical Field Emitters Using Femtosecond Laser-Assisted Etching of Silicon," Proc. IVMC 2001, 75-76, UC Davis, Davis, CA.
Carey, et al., "Field Emission from Silicon. Microstructures Formed by Femtosecond Laser Assisted Etching," Proc. CLEO 2001 (Baltimore, MD 2001) 555-557.
Carey, et al., "High Sensitivity Silicon-Based VIS/NIR Photodetectors", Optical Society of America (2003) 1-2.
Carey, III; "Femtosecond-laser Microstructuring of Silicon for Novel Optoelectronic Devices"; Harvard University, Jul. 2004; (Thesis).
Chang, S.W., V.P.Chuang, S.T.Boles, and C.V.Thompson, "Metal-Catalyzed Etching of Vertically Aligned Polysilicon and Amorphous Silicon Nanowire Arrays by Etching Direction Confinement", Advanced Functional Materials, vol. 20, No. 24, pp. 4364-4370, 2010.
Chen, Q. et al.; Broadband moth-eye antireflection coatings fabricated by low-cost nanoimprinting; Applied Physics Letters 94; pp. 263118-1-263118-3; 2009; American Institute of Physics.
Chien et al, "Pulse Width Effect in Ultrafast Laser Processing of Materials," Applied Physics A, 2005, 1257-1263, 81, Springer Berlin, Heidelberg, Germany.
Chiang, Wen Jen Et al., "Silicon Nanocrystal-Based Photosensor on Low-Temperature Polycrystalline-Silicone Panels", Applied Physics Letters, 2007, 51120-1-51120-3, Ltt. 91, American Inst. of Physics, Melville, NY.
Chichkov, B.N. et al, "Femtosecond, picosecond and nanosecond laser ablation of solids" Appl. Phys. A 63, 109-115; 1996.
Cilingiroglu et al., "An evaluation of MOS Interface-Trap Charge Pump as and Ultralow Constant-Current Generator," IEEE Journal of Solid-State Circuit, 2003, vol. 38, No. 1, Jan. 2003, 71-83.
Clapham, P.B. et al, "Reduction of Lens Reflexion by the Moth Eye Principle" Nature, vol. 244. Aug. 1973, pp. 281-282.
CMOSIS; "Global Shutter Image Sensors for Machine Vision Application"; Image Sensors Europe 2010, Mar. 23-25, 2010; .COPYRGT. copyright 2010.
Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.
Crouch et al., "Comparison of Structure and Properties of Femtosecond and Nanosecond Laser-Structured Silicon" Appl. Phys. Lett., 2004, 84,1850-1852.
Crouch et al., "Infrared Absorption by Sulfur-Doped Silicon Formed by Femtosecond Laser Irradiation", Appl. Phys. A, 2004, 79, 1635-1641.
Despeisse, et al.; "Thin Film Silicon Solar Cell on Highly Textured Substrates for High Conversion Efficiency"; 2004.
Detection of X-ray and Gamma-ray Photons Using Silicon Diodes; Dec. 2000; Detection Technology, Inc.; Micropolis, Finland.
Dewan, Rahul et al.; Light Trapping in Thin-Film Silicon Solar Cells with Submicron Surface Texture; Optics Express; vol. 17, No. 25; Dec. 7, 2009; Optical Society of America.
Deych et al.; Advances in Computed Tomography and Digital Mammography; Power Point; Nov. 18, 2008; Analogic Corp.; Peabody, MA.
Dobie, et al.; "Minimization of reflected light in photovoltaic modules"; Mar. 1, 2009.
Dobrzanski, L.A. et al.; Laser Surface Treatment of Multicrystalline Silicon for Enhancing Optical Properties; Journal of Materials Processing Technology; p. 291-296; 2007; Elsevier B.V.
Dolgaev et al., "Formation of Conical Microstructures Upon Laser Evaporation of Solids", Appl. Phys. A, 2001, 73, 177-181.
Duerinckx, et al.; "Optical Path Length Enhancement for >13% Screenprinted Thin Film Silicon Solar Cells"; 2006.
Dulinski, Wojciech et al.; Tests of backside illumincated monolithic CMOS pixel sensor in an HPD set-up; Nuclear Instruments and methods in Physics Research; Apr. 19, 2005; pp. 274-280; Elsevier B.V.
Forbes; "Texturing, reflectivity, diffuse scattering and light trapping in silicon solar cells"; 2012.
Forbes, L. and M.Y. Louie, "Backside Nanoscale Texturing to Improve IR Response of Silicon Photodetectors and Solar Cells," Nanotech, vol. 2, pp. 9-12, Jun. 2010.
Fowlkes et al., "Surface Microstructuring and Long-Range Ordering of Silicon Nanoparticles", Appl. Phys. Lett., 2002, 80 (20), 3799-3801.
Gibbons, J., "Ion Implantation in Semiconductors-Part II; Damage Production and Annealing", proceedings of the IEEE vol. 60, No. 9 pp. 1062-1096. Jun. 1972.
Gjessing, J. et al.; 2D back-side diffraction grating for impored light trapping in thin silicon solar cells; Optics Express; vol. 18, No. 6; pp. 5481-5495; Mar. 15, 2010; Optical Society of America.
Gjessing, J. et al.; 2D blazed grating for light trapping in thin silicon solar cells; 3 pages; 2010; Optical Society of America.
Gloeckler et al. Band-Gap Grading in CU(In,GA)Se2 Solar Cells, Journal of Physics and Chemistry of Solids; 2005; pp. 189-194; vol. 66.
Goetzberger, et al.; "Solar Energy Materials & Solar Cells"; vol. 92 (2008) pp. 1570-1578.
Han et al., "Evaluation of a Small Negative Transfer Gate Bias on the Performance of 4T CMOS Image Sensor Pixels," 2007 International Image Sensor Workshop, 238-240, Ogunquit, Maine.
Haug, et al.; "Light Trapping effects in thin film silicon solar cells"; 2009.
Her et al., "Microstructuring of Silicon with Femtosecond Laser Pulses," Applied Physics Letters, 1998, 1673-1675, vol. 73, No. 12, American Institute of Physics.
Her et al., "Novel Conical Microstructures Created in Silicon With Femtosecond Laser Pulses", CLEO 1998, 511-512, San Francisco, CA.
Her, et al., "Femtosecond laser-induced formation of spikes on silicon," Applied Physics A, 2000, 70, 383-385.
Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.
High-Performance Technologies for Advanced Biomedical Applications; .COPYRGT. 2004Brochure; pp. 1-46; PerkinElmerOptoelectronics.
Holland; Fabrication of Detectors and Transistors on High-Resistivity Silicon; Nuclear Instruments and Methods in Physics Research, vol. A275, pp. 537-541 (1989).
Hong et al., "Cryogenic processed metal-semiconductor-metal (MSM) photodetectors on MBE grown ZnSe,", 1999, IEEE Transactions on Electron Devices, vol. 46, No. 6, pp. 1127-1134.
Hsieh et al., "Focal-Plane-Arrays and CMOS Readout Techniques of Infrared Imaging Systems," IEE Transactions on Circuits and Systems for Video Technology, 1997, vol. 7, No. 4, Aug. 1997, 594-605.
Hu et al., "Solar Cells from Basic to Advanced Systems," McGraw Hill Book Co., 1983, 39, New York, New York.
Huang, et al.; "Microstructured silicon photodetector"; Applied Physics Letters 89; 033506; 2006 American Institute of Physics; 2006.
Huang, et al.; "Key Technique for texturing a uniform pyramid structure with a layer of silicon nitride on monocrystalline silicon wafer" Applied Surface Science; 2013 pp. 245-249.
Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.
Igalson et al. Defect States in the CIGS Solar cells by Photocapacitance and Deep Level Optical Spectroscopy; Bulletin of the Polish Academy of Sciences Technical Sciences; 2005; pp. 157-161; vol. 53(2).

(56) References Cited

OTHER PUBLICATIONS

"Infrared Absorption by Sulfur-Doped Silicon formed by Femtosecond Laser Irradiation"; Springer Berline/Heidelberg, vol. 79, Nov. 2004.
Jansen, H. et al., "The Black Silicon Method: a universal method for determining the parameter setting of a flourine-based reactive ion etcher in deep silicon trench etching with profile control",J. Micromech. Microeng. vol. 5, 1995 pp. 115-120.
Job et al., "Doping of Oxidized Float Zone Silincon by Thermal Donors—A low Thermal Budget Doping Method for Device Applications?" Mat. Res. Soc. Symp. Pro.; v. 719, F9.5.1-F9.5.6 (2002).
Joy, T. et al.; Development of a Production-Ready, Back-Illuminated CMOS Image Sensor with Small Pixels; Electron Devices Meeting; pp. 1007-1010; 2007; IEEE.
Juntunen et al.; Advanced Photodiode Detector for Medical CT Imaging: Design and Performance; 2007; pp. 2730-2735; IEEE.
Kim et al.; "Strong Sub-Band-Gap Infrared Absorption in Silicon Supersaturated with Sulfur"; 2006 Appl. Phys. Lett. 88, 241902-1-241902-3.
Koh et al., "Simple nanostructuring on silicon surfaceby means of focused beam patterning and wet etching", Applied Surface Science, 2000 pp. 599-603.
Kolasinski et al., "Laser Assisted and Wet Chemical Etching of Silicon Nanostructures," J. Vac. Sci. Technol., A 24(4), Jul./Aug. 2006, 1474-1479.
Konstantatos et al., "Engineering the Temproal Response of Photoconductive Photodetectors via Selective Introduction of Surface Trap States," Nano Letters, v. 8(5), pp. 1446-1450 (Apr. 2, 2008).
Konstantatos et al., "PbS Colloidal Quantum Dot Photoconductive Photodetectors: Transport, Traps, and Gain," Appl. Phys. Lett., v. 91, pp. 173505-1-173505-3 (Oct. 23, 2007).
Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.
Kroning et al.; X-ray Imaging Systems for NDT and General Applications; 2002; Fraunhofer Institute for Nondestructive Testing; Saarbrucken and Dresden, Germany.
Kryski; A High Speed 4 Megapixel Digital CMOS Sensor; 2007 International Image Sensor Workshop; Jun. 6-10, 2007.
Li, "Design and Simulation of an Uncooled Double-Cantilever Microbolometer with the Potential for .about.mK NETD," 2004, Sensors and Actuators A, 351-359, vol. 112, Elsevier B.V.
Li et al., "Gettering in High Resistive Float Zone Silicon Wafers," Transaction on Nuclear Science, vol. 36(1), pp. 290-294 (Feb. 1, 1989).
Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA.
Lin, A. et al.; Optimization of Random Diffraction Gratings in Thin-Film Solar Cells Using Genetic Algorithms; 2007; 1 page; SSEL Annual Report.
Low Dose Technologies; Power Point.
Madzharov, et al.; "Light trapping in thin-firm silicon solar cells for superstrate and substrate configuration" Abstract #1614, 218.sup.th ECS Meeting .COPYRGT. 2010 the Electrochemical Society.
"Masimo Rainbow SET Pulse CO-Oximetry," 2010, Masimo Corporation, Irvine, California, http://www.masimo.com/Rainbow/about.htm.
Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.
Matsuno, Shigeru et al.; Advanced Technologies for High Efficiency Photovoltaic Systems; Mitsubishi Electric Advance; vol. 122; pp. 17-19; Jun. 2008.
Meynants, et al.; "Backside illuminated global shutter COMOS image sensors"; 2011 International Image Sensor Workshop; Jun. 11, 2011.

Moloney, A.M. et al.; Novel Black Silicon PIN Photodiodes; 8 pages; Jan. 25, 2006; SPIE.
Moon et al. Selective emitter using porous silicon for crystalline silicon solar cells. Solar Energy Materials & Solar Cells, v. 93, pp. 846-850 (2009).
Moses; Nuclear Medical Imaging—Techniques and Challenges; Power Point; Feb. 9, 2005; Lawrence Berkeley National Laboratory Department of Functional Imaging.
Murkin, JM and Arangol, M, "Near Infrared spectroscopy as an index of rain and tissue oxygenation," Bri. J. of Anathesia (BJA/PGA Supplement):13-il3 (2009).
Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.
Myers, Richard et al., "Enhancing Near-IR Avalanche Photodiodes Performance by Femtosecond Laser Microstructuring" Harvard Dept. of Physics.
Nauka et al., Intrinsic Gettering in Oxygen-Free Silicon; App. Phys. Lett., vol. 46(7), Apr. 4, 1985.
Nauka et al., "New Intrinsic Gettering Process in Silicon Based on Interactions of Silicon Interstitials," J. App. Phys., vol. 60(2), pp. 615-621, Jul. 15, 1986.
Nayak et al, "Semiconductor Laesr Crystallization of a—Si:H," SPIE Digital Library, 2003, 277-380, vol. 4977, Bellingham, Washington. 2003.
Nayak et al, "Ultrafast-Laser-Assisted Chemical Restructuring of Silicon and Germanium Surfaces," Applied Surface Science, 2007, 6580-6583, vol. 253, Issue 15, Elsevier B.V.
Nayak et al, "Semiconductor Laser Crystallization of a—Si:H on Conducting Tin-Oxide-Coated Glass for Solar Cell and Display Applications," Applied Physics A, 2005, 1077-1080, 80, Springer Berlin, Heidelberg, Germany.
Nayak, B.K. et al.; Ultrafast Laser Textured Silicon Solar Cells; Mater. Res. Soc. Symp. Proc.; vol. 1123; 6 pages; 2009; Materials Research Society.
Nayak, et al.; "Efficient light trapping in silicon solar cells by ultrafast-laser-induced self-assembled micro/nano structures"; Progress in Photovoltaics: Research and Applications; 2011.
Oden, et al.; "Optical and Infrared Detection Using Microcantilevers;" SPIE Digital Library on Oct. 13, 2010; vol. 2744; 10 pages.
Ohring, Milton."The Materials of Science of Thin Films"; pp. 176-179; Academic Press, 1992.
Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.
Pain, Bedabrata; "A Back-Illuminated Megapixel CMOS Image Sensor"; http://hdl.handle.net/2014/39312; May 1, 2005.
Palm et al. CIGSSe Thin Film PB Modules: From Fundamental Investigators to Advanced Performance and Stability; Thin Solid Films; 2004; pp. 544-551; vol. 451-2.
Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.
Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.
Pedraza et al., "Surface Nanostructuring of Silicon", Appl. Phys. A, 2003, 77, 277-284.
Rashkeev et al., "Hydrogen passivation and Activation of Oxygen Complexes in Silicon," American Institute of Physics, vol. 78(11), pp. 1571-1573 (Mar. 12, 2001).
Russell, et al.; "Nanosecond Eximer Laser Processing for Novel Microelectronic Fabrication"; Nanosecond Excimer Laser Processing; 6 pages; 1989.
Russell, Ramirez and Kelley, "Nanosecond Excimer Laser Processing for Novel Microelectronic Devices," US Navy, SPAWAR, San Diego, Techical Report, 2003.
Russell, Ramirez, Kelley, "Nanosecond Excimer Laser Processing for Novel Microelectronic Fabrication," SSC Pacific Technical Reports , pp. 228-233, 2003, vol. 4, US Navy.

(56) References Cited

OTHER PUBLICATIONS

Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.
Sanchez et al., "Whiskerlike Structure Growth on Silicon Exposed to ArF Excimer Laser Irradiation", Appl. Phys. Lett., 1996, 69 (5), 620-622.
Sanchez et al., "Dynamics of the Hydrodynamical Growth of Columns on Silicon Exposed to ArF Excimer-Laser Irradiation ", Appl. Phys. A, 66, 83-86 (1998).
Sarnet et al.; "Femtosecond laser for black silicon and photovoltaic cells"; Feb. 21, 2008, Proc. of SPIE; vol. 6881; pags 1-15.
Senoussaoui, N. et al.; Thin-Film Solar Cells with Periodic Grating Coupler; Thin Solid Films; pp. 397-401; 2003; Elsevier B.V.
Serpenguzel et al., "Temperature Dependence of Photluminescence in Non-Crystalline Silicon", Photonics West (San Jose, CA, 2004) 454-462.
Shen et al., "Formation of Regular Arrays of Silicon Micorspikes by Femotsecond Laser Irradiation Through a Mask", Appl. Phys. Lett., 82, 1715-1717 (2003).
Solar Energy Research Institute, "Basic Photovoltaic Principles and Methods," Van Nostrand Reinhold Co., NY 1984, pp. 45-47 and 138-142.
Solhusvik, J. et al. "A 1280×960 3.75um pixel CMOS imager with Triple Exposure HDR," Proc. of 2009 International Image Sensor Workshop, Bergen, Norway, Jun. 22-28, 2009.
Stone et al.; The X-ray Sensitivity of Amorphous Selenium for Mammography;.Am. Assoc. Phys. Med.; Mar. 2002; pp. 319-324; vol. 29 No. 3; Am. Assoc. Phys. Med.
Szlufcik, J. et al.; Simple Integral Screenprinting process for selective emitter polycrystalline silicon solar cells; Applied Physics Letters; vol. 59, No. 13; Sep. 23, 1991; American Institute of Physics.
Tabbal et al., "Formation of Single Crystal Sulfur Supersaturated Silicon Based Junctions by Pulsed Laser Melting". 2007, J. Vac. Sci. Technol. B25(6), 1847-1852.
Takayanagi, et al.; "A 600.times.600 Pixel, 500, fps CMOS Image Sensor with a 4.4 jum Pinned Photodiode 5-Transistor Global Shutter Pixel"; 2007 International Image Sensor Workshop; Jun. 6-10, 2007.
Tower, John R. et al.; Large Format Backside Illuminated CCD Imager for Space Surveillance; IEEE Transactions on Electron Devices, vol. 50, No. 1; Jan. 2003; pp. 218-224.
Tull; "Femtosecond Laser Ablation of Silicon: Nanoparticles, Doping and Photovotaics"; Harvard University, Jun. 2007 (Thesis).
Uehara et al., "A High-Sensitive Digital Photosensor Using MOS Interface-Trap Charge Pumping," IEICE Electronics Express, 2004, vol. 1, No. 18, 556-561.
Wilson, "Depth Distributions of Sulfur Implanted Into Silicon as a Function of Ion energy, Ion Fluence, and Anneal Temperature," 1984, Appl. Phys. 55(10, 3490-3494.
Winderbaum, S. et al.; Reactive ion etching (RIE) as a method for texturing polycrystalline silicon solar cells; Solar Energy Materials and Solar Cells; 1997; pp. 239-248; Elsevier Science B.V.

Wu et al., "Black Silicon" Harvard UPS 1999.
Wu et al., "Black Silicon: A New Light Absorber," APS Centennial Meeting (Mar. 23, 1999).
Wu et al., "Femtosecond laser-gas-solid interactions," Thesis presented to the Department of Physics at Harvard University, pp. 1-113, 126-136, Aug. 2000.
Wu et al., "Visible Luminescence From Silicon Surfaces Microstructured in Air". Appl. Phys. Lett., vol. 81, No. 11, 1999-2001 (2002).
Wu, et al "Near-Unity Below-Band-Gap Absorption by Microstructured Silicon," 2001, Applied Physics Letters, 1850-1852, vol. 78, No. 13, American Institute of Physics.
Xu, Y., et al, "Infrared Detection Using Thermally Isolated Diode," Sensors and Actuators A, Elsevier Sequoia S.A., 1993, vol. 36, 209-217, Lausanne, Switzerland.
Yablonovitch, et al.; "Intensity Enhancement in Textured Optical Sheets for Solar Cells"; .COPYRGT. 1982 IEEE.
Yamamoto, K. et al.; NIR Sensitivity Enhancement by Laser Treatment for Si Detectors; Nuclear Instruments and Methods in Physics Research A; pp. 520-523; Mar. 31, 2010; Elsevier.
Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.
Yasutomi, et al.; "Two-Stage Charge Transfer Pixel Using Pinned Diodes for Low-Noise Global Shutter Imaging"; 2009 International Image Sensor Workshop; Mar. 28, 2009.
Younkin et al., "Infrared Absorption by Conical Silicon Microstructures Made in a Variety of Background Gases Using Femtosecond-Laser Pulses", J. Appl. Phys., 93, 2626-2629 (2003).
Younkin, "Surface Studies and Microstructure Fabrication Using Femtosecond Laser Pulses," Thesis presented to the Division of Engineering & Applied sciences at Harvard University (Aug. 2001).
Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.
Zaidi, S.H. et al.; Diffraction Grating Structures in Solar Cells; Photovoltaic Specialists Conference, 2000; 4 pages; Sep. 2000; IEEE.
Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.
Zhong, S. et al. "Excellent Light Trapping in Ultrathin Solar Cells," AFM-Journal, May 2016 pp. 1-11.
Zhu et al., "Evolution of Silicon Surface Microstructures by Picosecond and Femtosecond Laser Irradiations," Applied Surface Science, 2005, 102-108, Elsevie, Amsterdam, NL.Ultra-Shallow P+-Junction Formation in Silicon by Excimer Laser Doping: a Heat and Mass Transfer Perspective, Int. J. Heat Mass Transfer, 1996, 3835-3844, vol. 39, No. 18, Elsevier Science Ltd., Great Britain.
Ziou et al., "Depth from defocus using the hermite transform", Image Processing, 1998. ICIP 98. Intl. Conference on Chicago, IL. Oct. 1998 pp. 958-962.

* cited by examiner

PHOTOSENSITIVE IMAGING DEVICES AND ASSOCIATED METHODS

PRIORITY DATA

This application is a continuation of U.S. patent application Ser. No. 13/770,897, filed on Feb. 19, 2013, which is a continuation-in-part of U.S. patent application Ser. No. 13/050,557, filed on Mar. 17, 2011, which is a continuation-in-part of U.S. patent application Ser. No. 12/885,158, filed on Sep. 17, 2010, which claims the benefit of U.S. Provisional Patent Application Ser. No. 61/243,434, filed on Sep. 17, 2009, U.S. Provisional Patent Application Ser. No. 61/311,004 filed on Mar. 5, 2010, and U.S. Provisional Patent Application Ser. No. 61/311,107, filed on Mar. 5, 2010, each of which is incorporated herein by reference. U.S. patent application Ser. No. 13/050,557 also claims the benefit of U.S. Provisional Application Ser. No. 61/443,988, filed on Feb. 17, 2011, which is incorporated herein by reference.

BACKGROUND

The interaction of light with semiconductor materials has been a significant innovation. Silicon imaging devices are used in various technologies, such as digital cameras, optical mice, video cameras, cell phones, and the like. Charge-coupled devices (CCDs) were widely used in digital imaging, and were later improved upon by complementary metal-oxide-semiconductor (CMOS) imagers having improved performance. Many traditional CMOS imagers utilize front side illumination (FSI). In such cases, electromagnetic radiation is incident upon the semiconductor surface containing the CMOS devices and circuits. Backside illumination CMOS imagers have also been used, and in many designs electromagnetic radiation is incident on the semiconductor surface opposite the CMOS devices and circuits. CMOS sensors are typically manufactured from silicon and can covert visible incident light into a photocurrent and ultimately into a digital image. Silicon-based technologies for detecting infrared incident electromagnetic radiation have been problematic, however, because silicon is an indirect bandgap semiconductor having a bandgap of about 1.1 eV. Thus the absorption of electromagnetic radiation having wavelengths of greater than about 1100 nm is, therefore, very low in silicon.

SUMMARY

The present disclosure provides backside-illuminated photosensitive imager devices and associated methods. In one aspect, for example, a backside-illuminated photosensitive imager device can include a semiconductor substrate having multiple doped regions forming a least one junction, a textured region coupled to the semiconductor substrate and positioned to interact with electromagnetic radiation, and a passivation region positioned between the textured region and the at least one junction. The passivation region is positioned to isolate the at least one junction from the textured region, and the semiconductor substrate and the textured region are positioned such that incoming electromagnetic radiation passes through the semiconductor substrate before contacting the textured region. Additionally, the device includes an electrical transfer element coupled to the semiconductor substrate to transfer an electrical signal from the at least one junction. In some aspects, the passivation region is positioned to physically isolate the textured region from the at least one junction. In other aspects, the passivation region is positioned to electrically isolate the textured region from the at least one junction.

Various passivation region materials are contemplated for use, and any such material capable of providing the desired isolation properties is considered to be within the present scope. Non-limiting examples of such materials include oxides, nitrides, oxynitrides, and the like, including combinations thereof. In one specific aspect the passivation region includes an oxide. Furthermore, various physical configurations for the passivation region are also contemplated. In one aspect, for example, the passivation region is coupled directly to the at least one junction. In another aspect, the passivation region has a thickness of from about 5 nm to about 100 nm. In yet another aspect, the passivation region has a thickness of from about 20 nm to about 50 nm.

Additional regions and/or structures can be included in various devices according to aspects present disclosure. In some aspects, for example, the device can include a reflecting region positioned to reflect electromagnetic radiation passing through the textured region back through the textured region. Various reflective materials can be included in the reflecting region including, without limitation, a Bragg reflector, a metal reflector, a metal reflector over a dielectric material, and the like, including combinations thereof. In some aspects, a dielectric layer is positioned between the reflecting region and the textured region. In another aspect, a lens can be optically coupled to the semiconductor substrate and positioned to focus incident electromagnetic radiation into the semiconductor substrate.

Various materials can be utilized in the formation of the textured region, and any material capable of being associated with a photosensitive imager and textured is considered to be within the present scope. One general non-limiting example includes a dielectric material. Another example includes a polysilicon material.

In some cases the textured region can have a surface morphology operable to direct electromagnetic radiation into the semiconductor substrate. Non-limiting examples of textured region surface morphology includes sloping, pyramidal, inverted pyramidal, spherical, square, rectangular, parabolic, asymmetric, symmetric, and combinations thereof. Additionally, various aspects of the textured region can vary depending on the desired configuration of the device. In one aspect, for example, the textured region includes micron-sized and/or nano-sized surface features. Non-limiting examples of surface feature morphologies are contemplated, nonlimiting examples of which include cones, pillars, pyramids, micolenses, quantum dots, inverted features, gratings, and the like, including combinations thereof. Additionally, the textured region can be formed by a variety of processes, non-limiting examples of which include plasma etching, reactive ion etching, porous silicon etching, lasing, chemical etching (e.g. anisotropic etching, isotropic etching), nanoimprinting, material deposition, selective epitaxial growth, and the like, including combinations thereof.

In another aspect of the present disclosure, a backside-illuminated photosensitive imager array is provided. Such an array can include at least two photosensitive imager devices as has been described. In one aspect, at least one isolation feature is positioned between the at least two photosensitive imager devices. In yet another aspect, the at least one isolation feature is configured to optically or electrically isolate the at least two photosensitive imager devices. In still another example, the isolation feature can be a shallow or deep trench isolation feature.

The present disclosure also provides methods of making backside-illuminated photosensitive imager devices. For example, in one aspect such a method can include forming at least one junction at a surface of a semiconductor substrate, forming a passivation region over the at least one junction, and forming a textured region over the passivation region. The passivation region isolates the at least one junction from the textured region, and the semiconductor substrate and the textured region are positioned such that incoming electromagnetic radiation passes through the semiconductor substrate before contacting the textured region. The method additionally includes coupling an electrical transfer element to the semiconductor substrate such that the electrical transfer element is operable to transfer an electrical signal from the at least one junction. In another aspect, forming the textured region further includes depositing a semiconductor material on the passivation region and texturing the semiconductor material to form the textured region. In yet another aspect, forming the textured region further includes depositing a dielectric material on the passivation region and texturing the dielectric material to form the textured region.

The present disclosure additionally provides a backside-illuminated photosensitive imager device including a semiconductor substrate having multiple doped regions forming a least one junction, a textured region coupled to the semiconductor substrate and positioned to interact with electromagnetic radiation, and a passivation region positioned between the textured region and the at least one junction. The passivation region is positioned to isolate the at least one junction from the textured region, and the semiconductor substrate and the textured region are positioned such that incoming electromagnetic radiation passes through the semiconductor substrate before contacting the textured region. The device further includes at least one transistor coupled to the semiconductor substrate and with at least one of the transistors electrically coupled to the at least one junction.

BRIEF DESCRIPTION OF THE DRAWINGS

For a fuller understanding of the nature and advantage of the present invention, reference is being made to the following detailed description of preferred embodiments and in connection with the accompanying drawings, in which.

DETAILED DESCRIPTION

Figure 1:
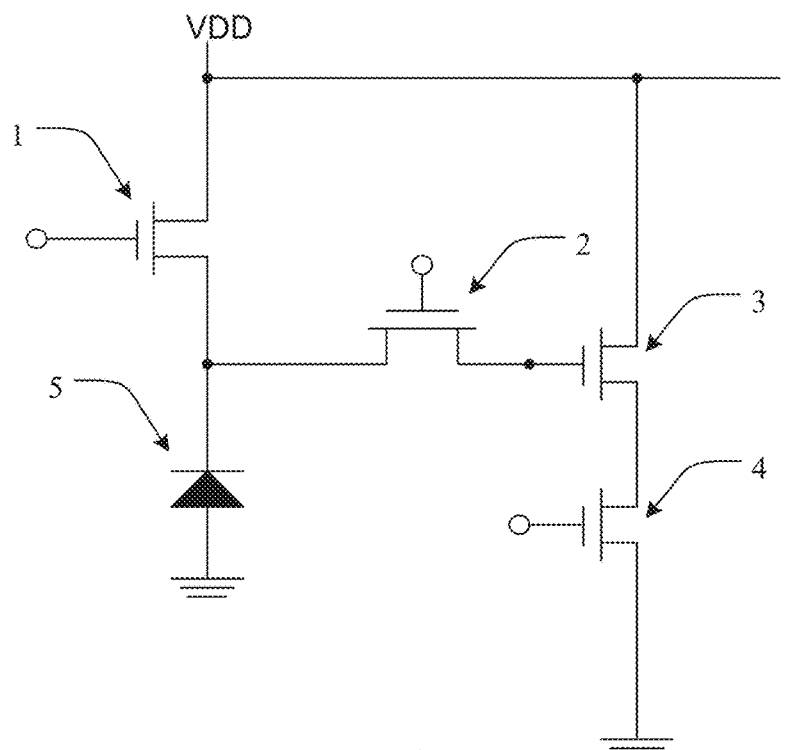
FIG. 1 is a schematic diagram of a four transistor active pixel sensor of a CMOS imager in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the terms "disordered surface" and "textured surface" can be used interchangeably, and refer to a surface having a topology with nano- to micron-sized surface variations formed by the irradiation of laser pulses or other texturing methods such as chemical etching as described herein. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 2 µm to about 60 µm). In yet another aspect, the surface can include nano-sized and/or micron-sized structures from about 5 nm and about 500 µm.

As used herein, the term "fluence" refers to the amount of energy from a single pulse of laser radiation that passes through a unit area. In other words, "fluence" can be described as the energy density of one laser pulse.

As used herein, the terms "surface modifying" and "surface modification" refer to the altering of a surface of a semiconductor material using a variety of surface modification techniques. Non-limiting examples of such techniques include plasma etching, reactive ion etching, porous silicon etching, lasing, chemical etching (e.g. anisotropic etching, isotropic etching), nanoimprinting, material deposition, selective epitaxial growth, and the like, including combinations thereof. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a substrate such as a semiconductor material.

As used herein, the term "target region" refers to an area of a substrate that is intended to be doped or surface modified. The target region of the substrate can vary as the surface modifying process progresses. For example, after a first target region is doped or surface modified, a second target region may be selected on the same substrate.

As used herein, the term "detection" refers to the sensing, absorption, and/or collection of electromagnetic radiation.

As used herein, the term "backside illumination" refers to a device architecture design whereby electromagnetic radiation is incident on a surface of a semiconductor material that is opposite a surface containing the device circuitry. In other words, electromagnetic radiation is incident upon and passes through a semiconductor material prior to contacting the device circuitry.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

Electromagnetic radiation can be present across a broad wavelength range, including visible range wavelengths (approximately 350 nm to 800 nm) and non-visible wavelengths (longer than about 800 nm or shorter than 350 nm). The infrared spectrum is often described as including a near infrared portion of the spectrum including wavelengths of approximately 800 to 1300 nm, a short wave infrared portion of the spectrum including wavelengths of approximately 1300 nm to 3 micrometers, and a mid to long wave infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

Traditional silicon photodetecting imagers have limited light absorption/detection properties. For example, such silicon based detectors are mostly transparent to infrared light. While other mostly opaque materials (e.g. InGaAs) can be used to detect infrared electromagnetic radiation having wavelengths greater than about 1000 nm, silicon is still commonly used because it is relatively cheap to manufacture and can be used to detect wavelengths in the visible spectrum (i.e. visible light, 350 nm-800 nm). Traditional silicon materials require substantial path lengths and absorption depths to detect photons having wavelengths longer than approximately 700 nm. While visible light can be absorbed at relatively shallow depths in silicon, absorption of longer wavelengths (e.g. 900 nm) in silicon of a standard wafer depth (e.g. approximately 750 µm) is poor if at all.

The devices of the present disclosure increase the absorption of semiconductor materials by increasing the absorption path length for longer wavelengths as compared to traditional materials. The absorption depth in conventional silicon detectors is the depth into silicon at which the radiation intensity is reduced to about 36% of the value at the surface of the semiconductor. The increased absorption path length results in an apparent reduction in the absorption depth, or a reduced apparent or effective absorption depth. For example, the effective absorption depth of silicon can be reduced such that these longer wavelengths can be absorbed at depths of less than or equal to about 850 µm. In other words, by increasing the absorption path length, these devices are able to absorb longer wavelengths (e.g. >1000 nm for silicon) within a thin semiconductor material. In addition to decreasing the effective absorption depth, the response rate or response speed can also be increased using thinner semiconductor materials.

Accordingly, backside-illuminated (BSI) photosensitive imager devices and associated methods are provided. Such devices provide, among other things, enhanced response in the near infrared light portion of the optical spectrum and improved response and quantum efficiency in converting electromagnetic radiation to electrical signals. As such, quantum efficiency (QE) of over 60% can be obtained in the visible region. Quantum efficiency can be defined as the percentage of photons that are converted into electrons. There are two types of QE, internal and external. Internal QE (IQE) describes the percentage of absorbed photons that are converted into electrons within the device. External QE (EQE) is the measurement of this conversion and the electrons that are collected outside of the device. The EQE is always lower than the IQE since there will inevitably be recombination effects and optical losses (e.g. transmission and reflection losses). One reason for improved performance with BSI is a higher fill factor or, in other words, the amount of light that can be collected in a single pixel. The various metal layers on top of a front side-illuminated sensor (FSI) limit the amount of light that can be collected in a pixel. As pixel sizes get smaller, the fill factor gets worse. BSI provides a more direct path for light to travel into the pixel, thus avoiding light blockage by the metal interconnect and dielectric layers on the top-side of the semiconductor substrate.

The present disclosure additionally provides BSI broadband photosensitive diodes, pixels, and imagers capable of detecting visible as well as infrared electromagnetic radiation, including associated methods of making such devices. A photosensitive diode can include a semiconductor substrate having multiple doped regions forming at least one junction, a textured region coupled to the semiconductor substrate and positioned to interact with electromagnetic radiation, and a passivation region positioned between the textured region and the at least one junction. The passivation region is positioned to isolate the at least one junction from the textured region, and the semiconductor substrate and the textured region are positioned such that incoming electromagnetic radiation passes through the semiconductor substrate before contacting the textured region.

In one aspect the multiple doped regions can include at least one cathode region and at least one anode region. In some aspects, doped regions can include an n-type dopant and/or a p-type dopant as is discussed below, thereby creating a p-n junction. In other aspects, a photosensitive device can include an i-type region to form a p-i-n junction.

A photosensitive pixel can include a semiconductor substrate having multiple doped regions forming at least one junction, a textured region coupled to the semiconductor substrate and positioned to interact with electromagnetic radiation, and a passivation region positioned between the textured region and the at least one junction. The passivation region is positioned to isolate the at least one junction from the textured region, and the semiconductor substrate and the textured region are positioned such that incoming electromagnetic radiation passes through the semiconductor substrate before contacting the textured region. Additionally, the photosensitive pixel also includes an electrical transfer element coupled to the semiconductor substrate and operable to transfer an electrical signal from the at least one junction. A photosensitive imager can include multiple photosensitive pixels. Additionally, an electrical transfer element can include a variety of devices, including without limitation, transistors, sensing nodes, transfer gates, transfer electrodes, and the like.

Photosensitive or photo detecting imagers include photodiodes or pixels that are capable of absorbing electromagnetic radiation within a given wavelength range. Such imagers can be passive pixel sensors (PPS), active pixel sensors (APS), digital pixel sensor imagers (DPS), or the like, with one difference being the image sensor read out architecture. For example, a semiconducting photosensitive imager can be a three or four transistor active pixel sensor (3T APS or 4T APS). Various additional components are also contemplated, and would necessarily vary depending on the particular configuration and intended results. As an example, a 4T configuration as is shown in FIG. 1 can additionally include, among other things, a transfer gate 2, a reset transistor 1, a source follower 3, a row select transistor 4, and a photodiode sensor 5. Additionally, devices having greater than 4 transistors are also within the present scope. Photosensor diode 5 can be a conventional pinned photodiode as used in current state of the art CMOS imagers.

As has been described, photosensitive imagers can be front side illumination (FSI) or back side illumination (BSI) devices. In a typical FSI imager, incident light enters the semiconductor device by first passing by transistors and metal circuitry. The light, however, can scatter off of the transistors and circuitry prior to entering the light sensing portion of the imager, thus causing optical loss and noise. A lens can be disposed on the topside of a FSI pixel to direct and focus the incident light to the light sensing active region of the device, thus partially avoiding the circuitry. In one aspect the lens can be a micro-lens. BSI imagers, one the other hand, are configured to have the depletion region of the junction extending to the opposite side of the device. In one aspect, for example, incident light enters the device via the light sensing portion and is mostly absorbed prior to reaching the circuitry. BSI designs allow for smaller pixel architecture and a high fill factor for the imager. It should also be understood that devices according to aspects of the present disclosure can be incorporated into complimentary metal-oxide-semiconductor (CMOS) imager architectures or charge-coupled device (CCD) imager architectures.

Figure 2:
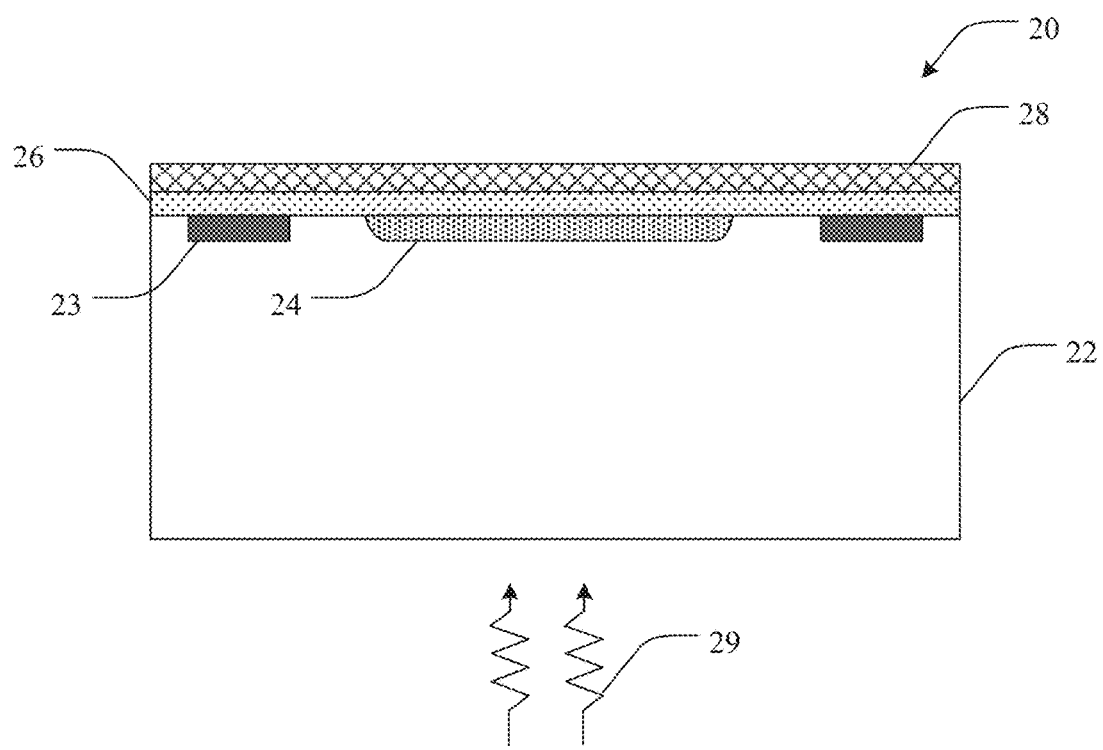
FIG. 2 is a schematic view of a photosensitive device in accordance with another aspect of the present disclosure.

In one aspect, as is shown in FIG. 2, a BSI photosensitive diode 20 can include a semiconductor substrate 22 having multiple doped regions 23, 24 forming at least one junction, and a textured region 28 coupled to the semiconductor substrate and positioned to interact with electromagnetic radiation. The multiple doped regions can have the same doping profile or different doping profiles, depending on the device. While the device shown in FIG. 2 contains three doped regions, it should be noted that other aspects containing one or more doped regions are considered to be within the present scope. Additionally, the semiconductor substrate can be doped, and thus can be considered to be a doped region in some aspects. A passivation region 26 is positioned between the textured region and the at least one junction. In one embodiment the passivation region can have a thickness in the range of about 10 nm to about 2 μm. In another embodiment the passivation region can have a thickness in the range of about 10 nm to about 100 nm. In yet another embodiment the passivation region can have a thickness of less than 50 nm. The passivation region is positioned to isolate the at least one junction from the textured region, and the semiconductor substrate and the textured region are positioned such that incoming electromagnetic radiation passes through the semiconductor substrate before contacting the textured region. The photosensitive diode is backside illuminated by electromagnetic radiation 29 that is incident on the side of the semiconductor substrate opposite the multiple doped regions.

Figure 3:
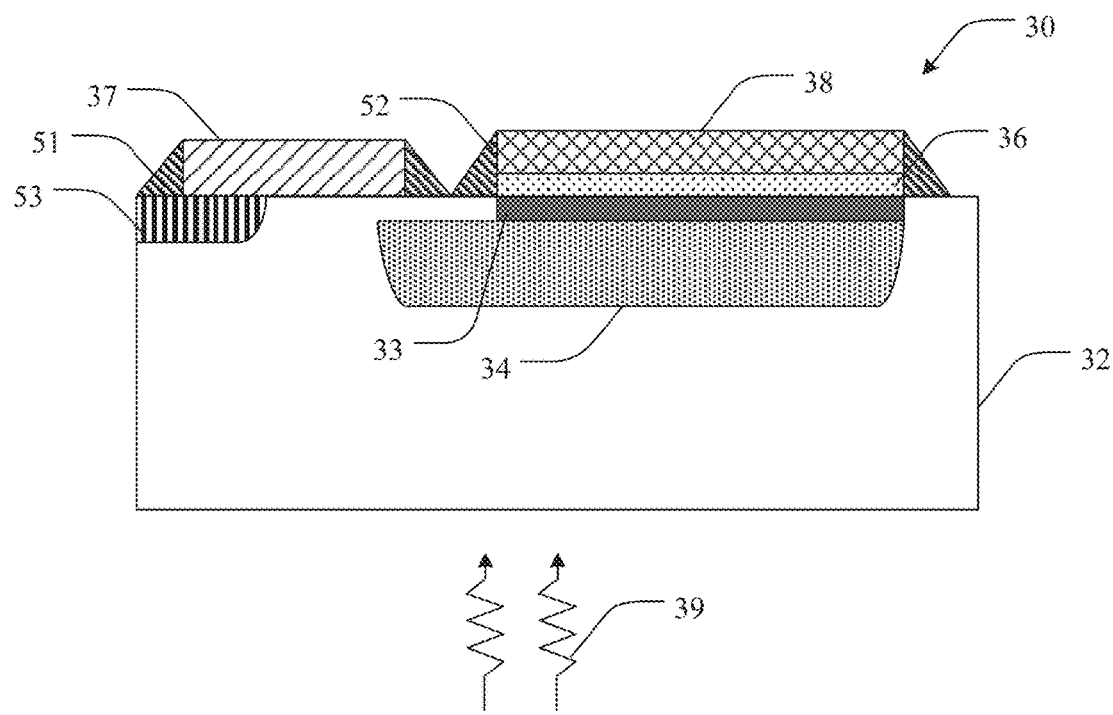
FIG. 3 is a schematic view of a photosensitive device in accordance with yet another aspect of the present disclosure.

In another aspect, as is shown in FIG. 3, a BSI photosensitive imager device 30 is provided. The BSI photosensitive imager device includes a semiconductor substrate 32 having multiple doped regions 33, 34 forming a least one junction, and a textured region 38 coupled to the semiconductor substrate and positioned to interact with electromagnetic radiation. A passivation region 36 is positioned between the textured region and the at least one junction to isolate the at least one junction from the textured region. The semiconductor substrate and the textured region are positioned such that incoming electromagnetic radiation 39 passes through the semiconductor substrate before contacting the textured region. An electrical transfer element 37 is coupled to the semiconductor substrate to transfer an electrical signal from the at least one junction. Side wall insulators 51 and 52 can also be formed about the transfer element 37 and passivation/textured regions, respectively, to insure proper spacing away from the transfer element. Additionally, a drain junction region 53 is electrically is electrically coupled to the transfer element to receive charge transferred thereto by the transfer element.

The various devices according to aspects of the present disclosure can exhibit increased quantum efficiency over traditional photosensitive devices. Any increase in the quantum efficiency makes a large difference in the signal to noise ratio. More complex structures can provide not only increased quantum efficiency but also good uniformity from pixel to pixel. In addition, devices of the present disclosure exhibit increased responsivity as compared to traditional photosensitive devices. For example, in one aspect the responsivity can be greater than or equal to 0.8 A/W for wavelengths greater than 1000 nm for semiconductor substrate that is less than 100 μm thick. In other embodiment the responsivity can be greater than 0.5 A/W for wavelengths greater than 1100 nm for semiconductor substrate that is less than 50 μm thick.

A variety of semiconductor materials are contemplated for use with the devices and methods according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, $Al_xGa_{1-x}As$), indium gallium arsenide (InGaAs, $In_xGa_{1-x}As$), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

The semiconductor substrate can be of any thickness that allows electromagnetic radiation detection and conversion functionality, and thus any such thickness of semiconductor material is considered to be within the present scope. In some aspects the textured region increases the efficiency of the device such that the semiconductor substrate can be thinner than has previously been possible. Decreasing the thickness of the semiconductor substrate reduces the amount of semiconductor material required to make such a device. In one aspect, for example, the semiconductor substrate has a thickness of from about 500 nm to about 50 μm. In another aspect, the semiconductor substrate has a thickness of less than or equal to about 100 μm. In yet another aspect, the semiconductor substrate has a thickness of from about 1 μm to about 10 μm. In a further aspect, the semiconductor substrate can have a thickness of from about 5 μm to about 50 μm. In yet a further aspect, the semiconductor substrate can have a thickness of from about 5 μm to about 10 μm.

Additionally, various types of semiconductor materials are contemplated, and any such material that can be incorporated into an electromagnetic radiation detection device is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous. Specific nonlimiting examples include amorphous silicon or amorphous selenium.

The semiconductor materials of the present disclosure can also be made using a variety of manufacturing processes. In some cases the manufacturing procedures can affect the efficiency of the device, and may be taken into account in achieving a desired result. Exemplary manufacturing processes can include Czochralski (Cz) processes, magnetic Czochralski (mCz) processes, Float Zone (FZ) processes, epitaxial growth or deposition processes, and the like. It is contemplated that the semiconductor materials used in the present invention can be a combination of monocrystalline material with epitaxially grown layers formed thereon.

The textured region can function to diffuse electromagnetic radiation, to redirect electromagnetic radiation, and to absorb electromagnetic radiation, thus increasing the quantum efficiency of the device. In the present BSI devices, electromagnetic radiation passing through the semiconductor substrate can contact the textured region. The textured region can include surface features to thus increase the effective absorption length of the photosensitive pixel. Such surface features can be micron-sized and/or nano-sized, and can be any shape or configurations. Non-limiting examples of such shapes and configurations include cones, pillars, pyramids, micolenses, quantum dots, inverted features, gratings, protrusions, and the like, including combinations thereof. Additionally, factors such as manipulating the feature sizes, dimensions, material type, dopant profiles, texture location, etc. can allow the diffusing region to be tunable for a specific wavelength. In one aspect, tuning the device can allow specific wavelengths or ranges of wavelengths to be absorbed. In another aspect, tuning the device can allow specific wavelengths or ranges of wavelengths to be reduced or eliminated via filtering.

Tuning can also be accomplished through the relative location of the texture region within the device, modifying the dopant profile(s) of regions within the device, dopant selection, and the like. Additionally, material composition near the textured region can create a wavelength specific photosensing pixel device. It should be noted that a wavelength specific photosensing pixel can differ from one pixel to the next, and can be incorporated into an imaging array. For example a 4×4 array can include a blue pixel, a green pixel, a red pixel, and infrared light absorbing pixel, or a blue pixel, two green pixels, and a red pixel.

Textured regions according to aspects of the present disclosure can allow a photosensitive device to experience multiple passes of incident electromagnetic radiation within the device, particularly at longer wavelengths (i.e. infrared). Such internal reflection increases the effective absorption length to be greater than the thickness of the semiconductor substrate. This increase in absorption length increases the quantum efficiency of the device, leading to an improved signal to noise ratio.

The materials used for making the textured region can vary depending on the design and the desired characteristics of the device. As such, any material that can be utilized in the construction of a textured region is considered to be within the present scope. Non-limiting examples of such materials include semiconductor materials, dielectric materials, silicon, polysilicon, amorphous silicon, transparent conductive oxides, and the like, including composites and combinations thereof. In one specific aspect, the textured layer is a textured polysilicon layer. Thus a polysilicon layer can be deposited onto the passivation region, and then textured to form the textured region. In another aspect, the textured layer is a textured dielectric layer. In this case the textured region is a portion of the dielectric layer making up the passivation region. In yet another aspect the textured layer is a transparent conductive oxide or another semiconductor material. In the case of dielectric layers, the textured region can be a textured portion of the passivation region or the textured region can be formed from other dielectric material deposited over the passivation region. In the case of semiconductor materials, forming the textured region can include depositing a semiconductor material on the passivation region and texturing the semiconductor material to form the textured region. The texturing process can texture the entire semiconductor material or only a portion of the semiconductor material. In one specific aspect, a polysilicon layer can be deposited over the passivation layer and textured and patterned by an appropriate technique (e.g. a porous silicon etch) to form the texture region. In yet another aspect, a polysilicon layer can be deposited over the passivation layer and textured and patterned by using a mask and photolithography and an etch to define a specific structure or pattern.

In addition to surface features, the textured region can have a surface morphology that is designed to focus or otherwise direct electromagnetic radiation. For example, in one aspect the textured region has a surface morphology operable to direct electromagnetic radiation into the semiconductor substrate. Non-limiting examples of various surface morphologies include sloping, pyramidal, inverted pyramidal, spherical, square, rectangular, parabolic, asymmetric, symmetric, and the like, including combinations thereof.

Figure 4:
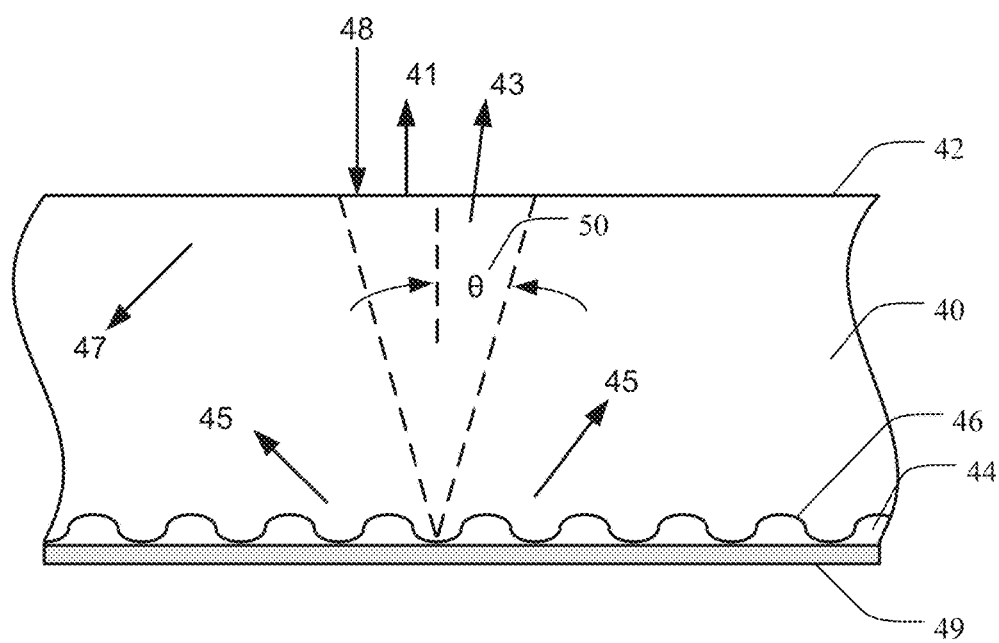
FIG. 4 is a schematic view of electromagnetic radiation reflection patterns in accordance with a further aspect of the present disclosure.

One example of such a surface morphology is shown in FIG. 4. Without intending to be limited to any operational theory, the following description provides one possible explanation for the effects of surface morphology on the direction of electromagnetic radiation. FIG. 4 shows a textured device having a surface morphology that affects the near infrared wavelength response. A semiconductor substrate 40 is shown having an illuminated surface 42 to receive incident electromagnetic radiation. The semiconductor substrate further has a textured region 44 (e.g. dielectric) coupled thereto at a surface that is opposite to the illuminated surface. The textured region has a surface morphology configured in an undulating pattern 46 with grooves, ridges, or similar patterns to produce an internal reflection that is not specular. In the near infrared the index of refraction of silicon is about $\eta=3.42$ and the reflectance is about $R=30\%$ from a single surface, and transmittance through a single surface is $T=70\%$ for normal incident waves. The absorption coefficient of silicon is very low in the near infrared. Electromagnetic radiation under normal incidence, represented by arrow 48, is reflected from the illuminated surface 42, and this is shown as arrow 41. There are successive reflections from both the illuminated surface and the opposing side, represented by arrows 43 and 45, and internal reflections from the illuminated surface, represented by arrow 47, resulting in a total internal reflection, if there is neither a reflective metal layer 49 nor textured region, the total transmittance, $T_{tot}$, is as shown in Equation (I) as:

$$T_{tot}=(TT)(1+R^2+R^4+\ldots)=(TT)/(1-R^2) \quad (I)$$

This result has been obtained using the sum of a geometric series. If both surfaces are just polished silicon-air then this results in a total transmittance of 54% and a reflectance of 46%.

If the increase in the individual path lengths caused by the diffuse scattering is neglected and if the absorption coefficient is very low then the total effective path length is determined by just the number of reflections, and the total absorption can be as shown in Equation (II):

$$A=\alpha d(1+R_2)(1+R_1R_2+R_1^2R_2^2+\ldots)=\alpha d(1+R_2)/(1-R_1R_2) \quad (II)$$

Here, $\alpha$, is the absorption coefficient in reciprocal cm and, d, is the thickness of the sample in cm, and the effective increase in path length is $Enh=(1+R_2)/(1-R_1R_2)$. The internal quantum efficiency, IQE, in the infrared where the absorption in silicon is low is then, $IQE=\alpha d(Enh)$. The external quantum efficiency, EQE, is $EQE=T_1 IQE$ and $EQE=T_1\alpha d(Enh)$.

If both sides of an infrared photo detector are polished then $T_1=T_2=0.70$ and $R_1=R_2=0.3$, which gives $Enh=1.4$, $IQE=1.4$ ad and $EQE=\alpha d$. If one side is polished and the other side has an oxide and then a metal reflector then $R1=0.3$ and $R2=1.0$, this yields an enhancement in infrared absorption or $Enh=3$. $T_1$, is the transmittance of radiation incident on the first surface. $T_2$, is the transmittance of radiation striking the second surface from the semiconductor side. $R_1$ is the amount of radiation reflected back into the semiconductor for radiation striking the first surface from the semiconductor side. $R_2$ is the amount of radiation reflected back into the semiconductor for radiation striking the second surface from the semiconductor side.

In one aspect that can improve the infrared response, the illuminated side 42 is polished but the opposing side 46 is a textured dielectric material 44, with a reflecting region 49. The texturing can be realized in a fashion to produce a true diffuse scattering (i.e. a Lambertian scattering), at the infrared wavelengths. This diffuse scattering layer/reflecting layer combination, in essence, yields an $R_2=100\%$, a diffuse reflector. The reflectance of the polished front side to the scattered light radiation is determined by solid angle considerations. Any incident light with an angle of incidence greater than the critical angle, $\theta$ 50, will be totally internal reflected, 47. If the backside scattering is totally diffuse or Lambertian, the transmittance is then determined by the area of the surface, $\pi^2$, within the critical angle $\theta$ (labeled 50), in this case 17° for silicon and air. The radius of the circle is $r = d \sin(17)$, where, d, is the thickness of the sample. This area is divided by the area of the half sphere, $2\pi d^2$. If the backside scattering is totally diffuse the transmittance of the front planar surface is then roughly $T_1=3\%$ and the reflectance $R_1=97\%$. The path length enhancement factor can be very large, as is shown in Equation (III):

$$\text{Enh}=(1+R_2)/(1-R_1R_2)=66 \tag{III}$$

This would result in an IQE=66αd and an EQE=46. If the backside includes a textured region and a truly diffusive scattering surface and a mirror-like surface is used behind the back side, a very large enhancement of absorption in the near infrared can be achieved. If the absorption in the semiconductor substrate is not assumed to be small but rather is taken into account it can be shown that the enhancement factor for the IQE due to multiple reflections is modified from Equation (I) and as is shown in Equation (IV):

$$\text{Enh}=(1-\exp(-\alpha d))(1+R_2\exp(-\alpha d))/(1-R_1R_2\exp(-2\alpha d)) \tag{IV}$$

Figure 5:
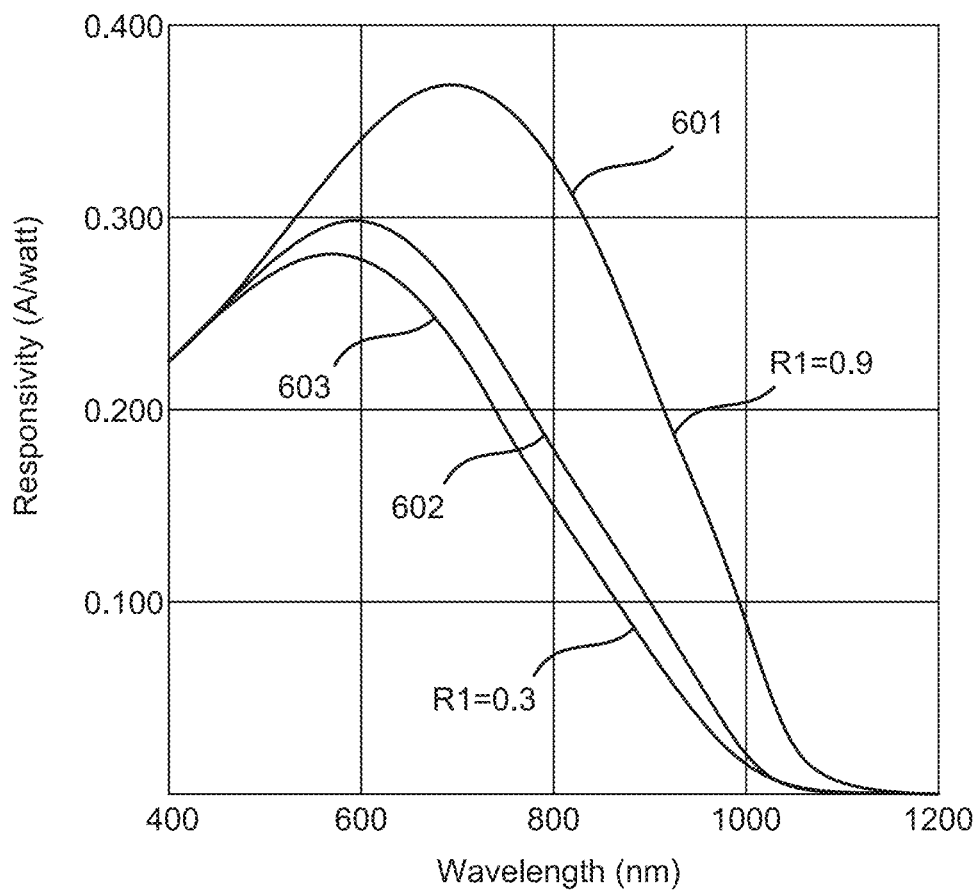
FIG. 5 is a graph showing calculated absorption of infrared radiation in a thin silicon photodetector with light trapping and different amounts of light reflected back from the illuminated surface.

This allows a calculation of the responsivity, in terms of the electrical current in Amperes per incident light power in Watts, of photo detectors of different thickness, d, for different wavelengths, $\lambda$, since the absorption coefficient, $\alpha(\lambda)$, is a function of wavelength, as is shown in FIG. 5. If it is assumed that the textured side is an ideal reflector, $R_2=1.0$, and the amount of diffusive scattering of the textured surface varies from that of a planar surface, then the fraction of light reflected back from the opposing illuminated surface will vary. If the textured surface is planar, then there is only specular reflection, and $R_1=0.3$; if the textured surface is an ideal Lambertian diffusive surface then the fraction of light reflected back from the front surface will be very large, $R_1=0.97$. Several values of $R_1$ as illustrated by curves, 601, 602, and 603 are discussed herein, and illustrated in FIG. 5, for a diffuse reflector, and these represent the fraction of light internally reflected back at the front surface. For purposes of the present disclosure, values of $R_1 \geq 0.9$, curve 601, are deemed useful. The enhancement in absorption described by Equation (IV) then varies with the fraction of light radiation reflected back from the illuminated surface and thickness of the sample, as is illustrated in FIG. 5. It should be noted that, while the techniques described herein have been used to enhance the absorption of infrared and red light radiation, they are also applicable to visible light as the thickness of the silicon layer becomes thinner. Scattering and multiple internal reflections can also be used to increase the absorption of yellow, green and even blue light that will not be totally absorbed in single passes within thin silicon layers. These techniques can be applied then to visible imagers with thin silicon absorption layers.

The textured region, including surface features as well as surface morphologies, can be formed by various techniques, including plasma etching, reactive ion etching, porous silicon etching, lasing, chemical etching (e.g. anisotropic etching, isotropic etching), nanoimprinting, material deposition, selective epitaxial growth, and the like. In one aspect, the texturing process can be performed during the manufacture of the photosensitive device. In another aspect, the texturing process can be performed on a photosensitive device that has previously been made. For example, a CMOS, CCD, or other photosensitive element can be textured following manufacture. In this case, material layers may be removed from the photosensitive element to expose the semiconductor substrate or the passivation region upon which a textured region can be formed.

One effective method of producing a textured region is through laser processing. Such laser processing allows discrete locations of the passivation region or other substrate to be textured. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection. The laser treated region can be associated with the surface nearest the impinging electromagnetic radiation or, in the case of BSI devices, the laser treated surface can be associated with a surface opposite in relation to impinging electromagnetic radiation, thereby allowing the radiation to pass through the semiconductor substrate before it hits the laser treated region.

In one aspect, for example, a target region of the semiconductor material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a substrate material is irradiated with laser radiation to form a textured or surface modified region. Such laser processing can occur with or without a dopant material. In those aspects whereby a dopant is used, the laser can be directed through a dopant carrier and onto the substrate surface. In this way, dopant from the dopant carrier is introduced into the target region of the substrate material. Such a region incorporated into a substrate material can have various benefits in accordance with aspects of the present disclosure. For example, the target region typically has a textured surface that increases the surface area of the laser treated region and increases the probability of radiation absorption via the mechanisms described herein. In one aspect, such a target region is a substantially textured surface including micron-sized and/or nano-sized surface features that have been generated by the laser texturing. In another aspect, irradiating the surface of the substrate material includes exposing the laser radiation to a dopant such that irradiation incorporates the dopant into the substrate. Various dopant materials are known in the art, and are discussed in more detail herein.

Thus the surface of the substrate or passivation region is chemically and/or structurally altered by the laser treatment, which may, in some aspects, result in the formation of surface features appearing as microstructures or patterned areas on the surface and, if a dopant is used, the incorporation of such dopants into the substrate material. In some aspects, the features or microstructures can be on the order of 50 nm to 20 μm in size and can assist in the absorption of electromagnetic radiation. In other words, the textured surface can increase the probability of incident radiation being absorbed.

The type of laser radiation used to surface modify a material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, pulse width, pulse fluence, pulse frequency, polarization, laser propagation direction relative to the semiconductor material, etc. In one aspect, a laser can be configured to provide pulsatile lasing of a material. A short-pulsed laser is one capable of producing femtosecond, picosecond and/or nanosecond pulse durations. Laser pulses can have a central wavelength in a range of about from about 10 nm to about 8 μm, and more specifically from about 200 nm to about 1200 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths can be in the range of from about 50 picoseconds to 100 nanoseconds. In another aspect, laser pulse widths are in the range of from about 50 to 500 femtoseconds.

The number of laser pulses irradiating a target region can be in a range of from about 1 to about 2000. In one aspect, the number of laser pulses irradiating a target region can be from about 2 to about 1000. Further, the repetition rate or frequency of the pulses can be selected to be in a range of from about 10 Hz to about 10 μHz, or in a range of from about 1 kHz to about 1 MHz, or in a range from about 10 Hz to about 1 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

A variety of dopant materials are contemplated for both the formation of the multiple doped regions and incorporation by a texturing technique, and any such dopant that can be used in such processes to surface modify a material is considered to be within the present scope. It should be noted that the particular dopant utilized can vary depending on the material being doped, as well as the intended use of the resulting material. For example, the selection of potential dopants may differ depending on whether or not tuning of the photosensitive device is desired.

A dopant can be either charge donating or accepting dopant species. More specifically, an electron donating or a hole donating species can cause a region to become more positive or negative in polarity as compared to the semiconductor substrate. In one aspect, for example, the doped region can be p-doped. In another aspect the doped region can be n-doped. A highly doped region can also be formed on or near the doped region to create a pinned diode. In one non-limiting example, the semiconductor substrate can be negative in polarity, and a doped region and a highly doped region can be doped with p+ and n dopants respectively. In some aspects, variations of n(−−), n(−), n(+), n(++), p(−−), p(−), p(+), or p(++) type doping of the regions can be used. It should be noted that in one aspect the highly doped region can be a textured region. In other words, textured surface features can be formed on or in a highly doped region. In another aspect, at least a portion of the textured region, or the material from which the textured region is generated, can be doped with a dopant to generate a back surface field. A back surface field can function to impede the movement of photo-generated carriers from the junction toward the textured region.

In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of between about $5 \times 10^{14}$ and about $1 \times 10^{16}$ ions/cm$^2$. Non-limiting examples of fluorine-containing compounds can include $ClF_3$, $PF_5$, $F_2$ $SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^4$ mol/cm$^3$. As one non-limiting example, $SF_6$ gas is a good carrier for the incorporation of sulfur into the semiconductor material via a laser process without significant adverse effects on the material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

As a further processing note, the semiconductor substrate can be annealed for a variety of reasons, including dopant activation, semiconductor damage repair, and the like. The semiconductor substrate can be annealed prior to texturing, following texturing, during texturing, or any combination thereof. Annealing can enhance the semiconductive properties of the device, including increasing the photoresponse properties of the semiconductor materials by reducing any imperfections in the material. Additionally, annealing can reduce damage that may occur during the texturing process. Although any known anneal can be beneficial and would be considered to be within the present scope, annealing at lower temperatures can be particularly useful. Such a "low temperature" anneal can greatly enhance the external quantum efficiency of devices utilizing such materials. In one aspect, for example, the semiconductor substrate can be annealed to a temperature of from about 300° C. to about 1100 C°. In another aspect, the semiconductor substrate can be annealed to a temperature of from about 500° C. to about 900° C. In yet another aspect, the semiconductor substrate can be annealed to a temperature of from about 700° C. to about 800° C. In a further aspect, the semiconductor substrate can be annealed to a temperature that is less than or equal to about 850° C.

The duration of the annealing procedure can vary according to the specific type of anneal being performed, as well as according to the materials being used. For example, rapid annealing processes can be used, and as such, the duration of the anneal may be shorter as compared to other techniques. Various rapid thermal anneal techniques are known, all of which should be considered to be within the present scope. In one aspect, the semiconductor substrate can be annealed by a rapid annealing process for a duration of greater than or equal to about 1 μs. In another aspect, the duration of the rapid annealing process can be from about 1 μs to about 1 ms. As another example, a baking or furnace anneal process can be used having durations that may be longer compared to a rapid anneal. In one aspect, for example, the semiconductor substrate can be annealed by a baking anneal process for a duration of greater than or equal to about 1 ms to several hours.

Various types of passivation region configurations are contemplated, and any configuration that can be incorporated into a photosensitive device is considered to be within the present scope. One benefit to such a passivation region pertains to the isolation provided between the textured region and the doped regions that form the junction. In one aspect, for example, the passivation region can be positioned to physically isolate the textured region from the junction. In this way, the creation of the textured region can be isolated from the doped regions, thus precluding undesirable effects of the texturing process from affecting the junction. In another aspect, the passivation region can be a dielectric material, and thus the passivation region could be used to electrically isolate the textured region from the junction. In some cases, the passivation region is coupled directly to at least one of the doped regions forming the junction.

The passivation region can be made from a variety of materials, and such materials can vary depending on the device design and desired characteristics. Non-limiting examples of such materials can include oxides, nitrides, oxynitrides, and the like, including combinations thereof. In one specific aspect, the passivation region includes an oxide. Additionally, the passivation region can be of various thicknesses. In one aspect, for example, the passivation region has a thickness of from about 100 nm to about 1 micron. In another aspect, the passivation region has a thickness of from about 5 nm to about 100 nm. In yet another aspect, the passivation region has a thickness of from about 20 nm to about 50 nm. It should be noted that, in cases where the textured region is a portion of the passivation region (e.g. a dielectric layer) that has been textured, the thickness of the passivation material would be increased to account for the texturing. Thus the thickness ranges for the passivation region provided here would be measured as the thickness of the passivation region not including the textured portion.

Figure 6:
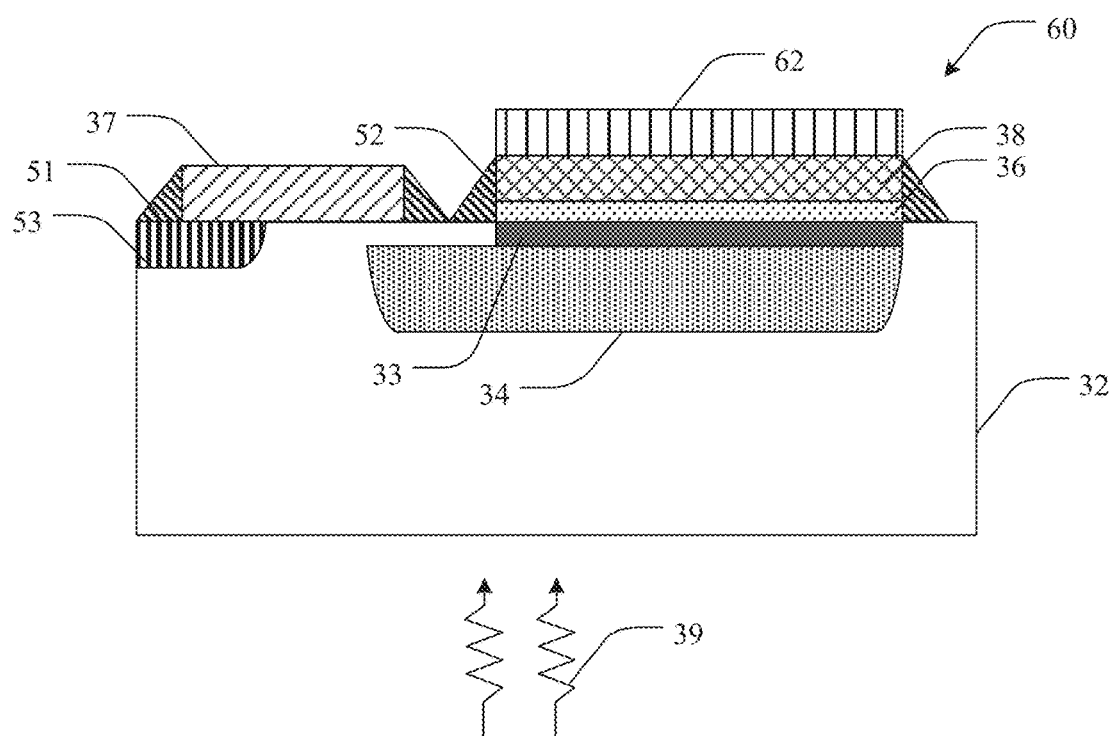
FIG. 6 is a schematic view of a photosensitive device in accordance with another aspect of the present disclosure.

The devices according to aspects of the present disclosure can additionally include one or more reflecting regions. In one aspect, as is shown in FIG. 6, a BSI photosensitive imager device 60 can include a reflecting region 62 coupled to the textured region 38. It should be noted that all reference numbers in FIG. 6 that have been reused from previous figures and will be reused in subsequent figures denote the same or similar materials and/or structures whether or not further description is provided. The reflecting region can be deposited over the entire textured region or only over a portion of the textured region. In some aspects, the reflecting region can be deposited over a larger area of the device than the textured region. The reflecting region can be positioned to reflect electromagnetic radiation passing through the texture region back through the textured region. In other words, as electromagnetic radiation passes into the semiconductor substrate 32, a portion that is not absorbed contacts the textured region. Of that portion that contacts the textured region, a smaller portion may pass though the textured region to strike the reflecting region and be reflected back through the textured region toward the semiconductor substrate.

Figure 7:
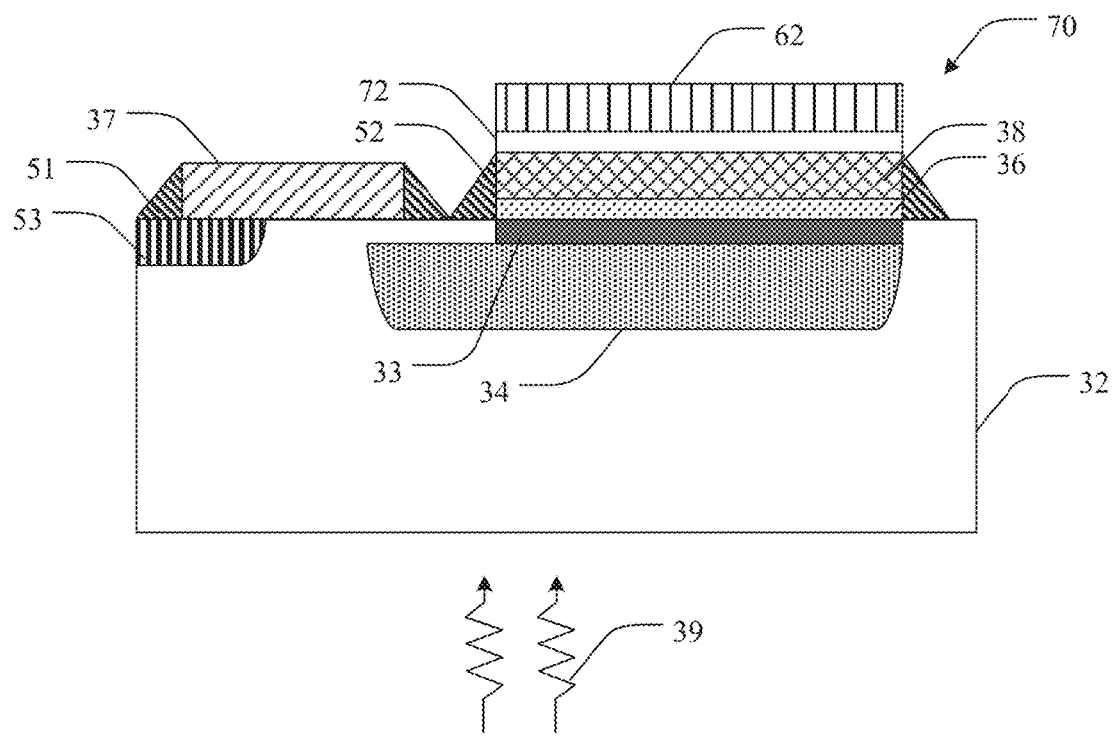
FIG. 7 is a schematic view of a photosensitive device in accordance with another aspect of the present disclosure.

A variety of reflective materials can be utilized in constructing the reflecting region, and any such material capable of incorporation into a photosensitive device is considered to be within the present scope. Non-limiting examples of such materials include a Bragg reflector, a metal reflector, a metal reflector over a dielectric material, a transparent conductive oxide such as zinc oxide, indium oxide, or tin oxide, and the like, including combinations thereof. Non-limiting examples of metal reflector materials can include silver, aluminum, gold, platinum, reflective metal nitrides, reflective metal oxides, and the like, including combinations thereof. In one aspect, as is shown in FIG. 7, a BSI photosensitive imager device 70 can include a dielectric layer 72 positioned between the reflecting region 62 and the textured region 38. It should be noted that all reference numbers in FIG. 7 that have been reused from previous figures and will be reused in subsequent figures denote the same or similar materials and/or structures whether or not further description is provided. In one specific aspect, the dielectric layer can include an oxide layer and the reflecting region can include a metal layer. The surface of the metal layer on an oxide acts as a mirror-like reflector for the incident electromagnetic radiation from the backside. It should be noted that the reflective region is not biased with a voltage.

In another aspect, the textured region 38 can include a hemispherical grained polysilicon or coarse grained polysilicon material and the reflective region 62 can include a metal layer. The hemispherical grained or coarse grained silicon can act as a diffusive scattering site for the incident optical radiation and the dielectric layer 72 and the reflective region together can act as a reflector.

In still another aspect, the photosensitive imager can include selective epitaxial silicon growth for generating the textured region on top of the junction formed by the doped regions (e.g. a photodiode) without the passivation region being present (not shown). An oxide and metal reflector, for example, can be coupled to the textured region. The epitaxial growth places the textured region away from the top of the junction, and the rapid etch characteristics of grain boundaries can be used to create texturing.

Additionally, the textured surface of a metal on a roughened oxide can act as a diffusive scattering site for the incident electromagnetic radiation and also as a mirror-like reflector. Other aspects can utilize porous materials for the texturing. Porous polysilicon, for example, can be oxidized or oxide deposited and a reflective region such as a metal reflector can be associated therewith to provide a scattering and reflecting surface. In another aspect, aluminum can be subjected to anodic oxidation to provide porous aluminum oxide, a high dielectric constant insulator. This insulator can be coated with aluminum or other metals to provide a scattering and reflecting surface.

In one specific aspect, a reflective region can include a transparent conductive oxide, an oxide, and a metal layer. The transparent oxide can be textured and a metal reflector deposited thereupon. The textured surface of the metal on a roughened transparent conductive oxide can act as a diffusive scattering site for the incident electromagnetic radiation.

In another specific aspect, a Bragg reflector can be utilized as a reflective region. A Bragg reflector is a structure formed from multiple layers of alternating materials with varying refractive indexes, or by a periodic variation of some characteristic (e.g. height) of a dielectric waveguide, resulting in periodic variation in the effective refractive index in the guide. Each layer boundary causes a partial reflection of an optical wave. For waves whose wavelength is close to four times the optical thickness of the layers, the many reflections combine with constructive interference, and the layers act as a high-quality reflector. Thus the coherent super-positioning of reflected and transmitted light from multiple interfaces in the structure interfere so as to provide the desired reflective, transmissive, and absorptive behavior. In one aspect, the Bragg reflector layers can be alternating layers of silicon dioxide and silicon. Because of the high refractive index difference between silicon and silicon dioxide, and the thickness of these layers, this structure can be fairly low loss even in regions where bulk silicon absorbs appreciably. Additionally, because of the large refractive index difference, the optical thickness of the entire layer set can be thinner, resulting in a broader-band behavior and fewer fabrications steps.

Additional scattering can be provided by positioning a textured forward scattering layer on the side of the pixel opposing the doped photodiode regions or on the illuminated side. These forward scattering layers can be, without limitation, textured oxides or polysilicon without a reflector. These layers can be spaced away from the back side surface of the pixel and would provide scattering of the light in addition to that provided by layers on the front side of the pixel adjacent to the photodiode and transistor doped regions.

Figure 8:
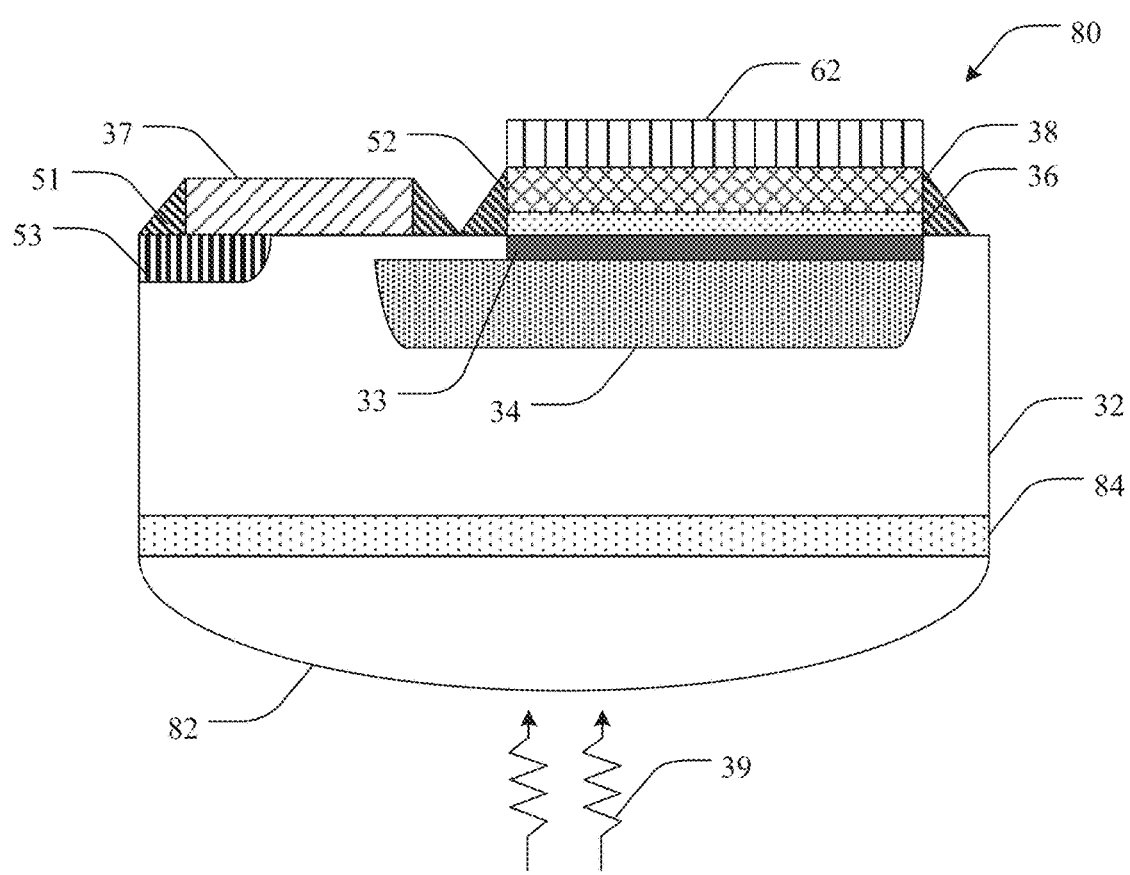
FIG. 8 is a schematic view of a photosensitive device in accordance with yet another aspect of the present disclosure.

In one aspect, as is shown in FIG. 8, a BSI photosensitive imager device 80 can include a lens 82 coupled to the semiconductor substrate 32 on a side facing incident electromagnetic radiation. It should be noted that all reference numbers in FIG. 8 that have been reused from previous figures denote the same or similar materials and/or structures whether or not further description is provided. Thus the lens can focus the electromagnetic radiation more effectively into the semiconductor substrate. In the case of a BSI photosensitive device, the lens is disposed on the backside of the device. Additionally, an anti-reflective coating 84 can be associated with the device between the semiconductor substrate and the lens. It should be noted that the present scope also includes aspects having a lens without an anti-reflecting coating, and aspects having an anti-reflecting coating associated with the semiconductor substrate without a lens. Additionally, a color filter (not shown) can be optically coupled to the lens to allow specific wavelengths filtering of the electromagnetic radiation. Incident electromagnetic radiation passing through the color filter prior to contacting the semiconductor substrate can be filtered according to the characteristics of the filter.

Figure 9:
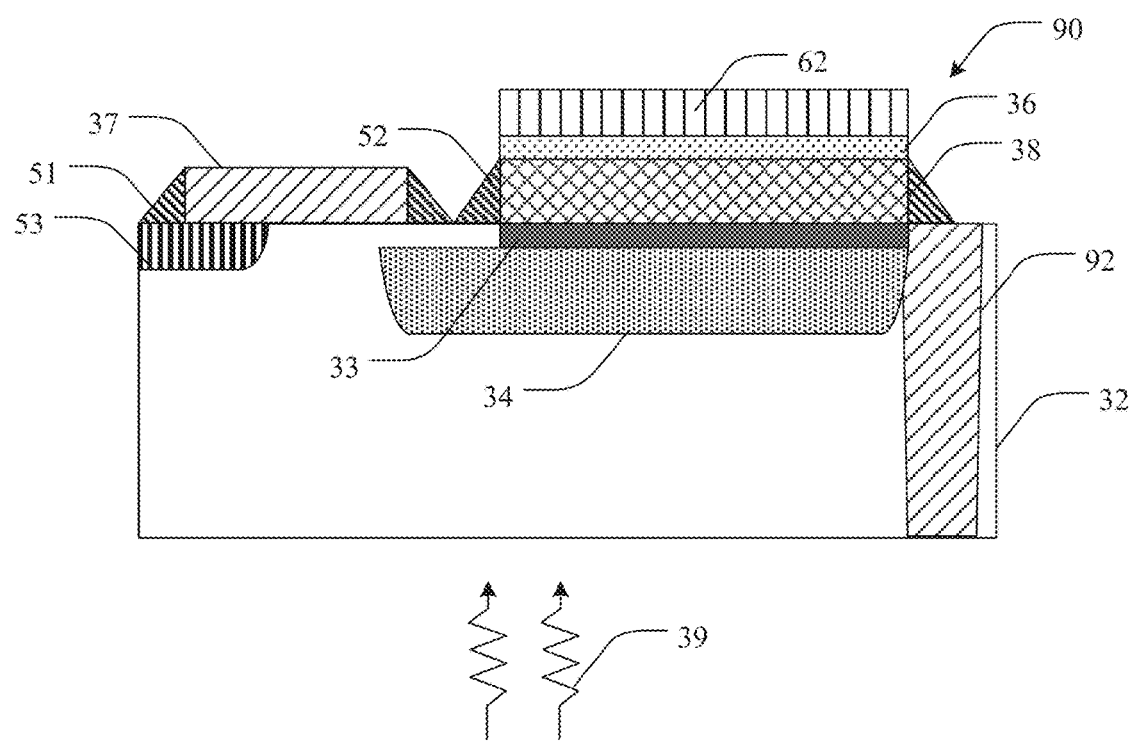
FIG. 9 is a schematic view of a photosensitive device in accordance with a further aspect of the present disclosure.

In another aspect, as is shown in FIG. 9, a BSI photosensitive imager device 90 can also include at least one isolation feature 92 associated with the semiconductor substrate 32. It should be noted that all reference numbers in FIG. 9 that have been reused from previous figures denote the same or similar materials and/or structures whether or not further description is provided. Isolation features can maintain pixel to pixel uniformity when multiple pixels are used in association by reducing optical and electrical crosstalk there between. The isolation feature can be shallow or deep, depending on the desired design. The isolation features can be generated using various materials including, without limitation, dielectric materials, reflective materials, conductive materials, light diffusing features, and the like. Additionally, in some aspects the isolation feature can be a void in the semiconductor substrate. In one aspect, isolation features can also be configured to reflect incident electromagnetic radiation until it is absorbed, thereby increase the effective absorption length of the device. Furthermore, the devices according to aspects of the present disclosure can also independently include one or more vias, passivation layers, and the like (not shown).

Figure 10:
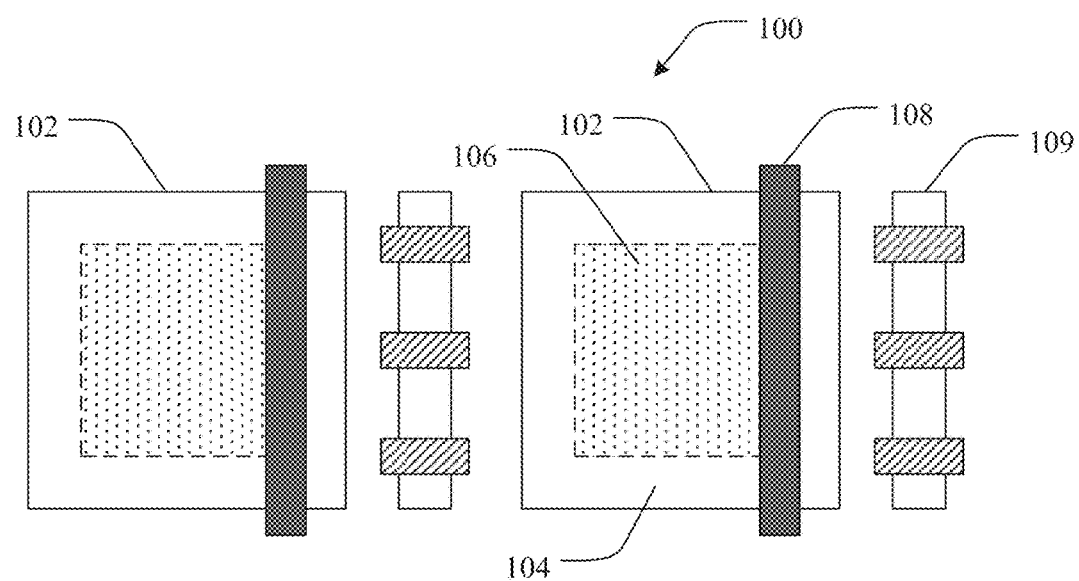
FIG. 10 is a schematic view of a photosensitive imager device in accordance with yet another aspect of the present disclosure.

FIG. 10 shows a photosensitive imager 100 comprising two photosensitive pixels 102. Each photosensitive pixel includes a boundary region 104 that can include circuitry and a textured region 106. Each photosensitive pixel can include at least one transistor 108 or other electrical transfer element. Additional read out and circuitry elements 109 can be utilized and shared by both photosensitive pixels.

Figure 11:
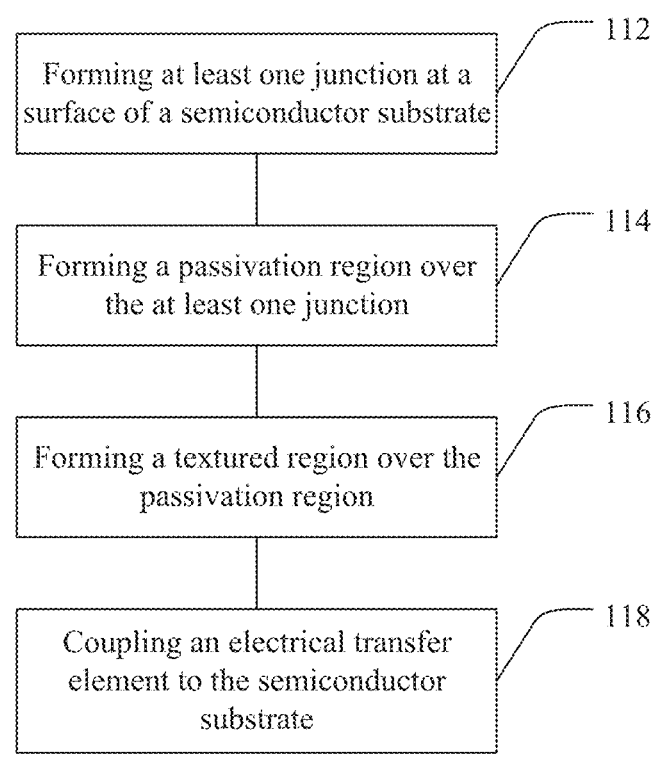
FIG. 11 is a depiction of a method of making a photosensitive imager device in accordance with yet another aspect of the present disclosure.

In other aspects of the present disclosure, various methods of making photosensitive diodes, pixels, and imagers, are contemplated. In one aspect, as is shown in FIG. 11, a method of making a backside-illuminated photosensitive imager device can include forming at least one junction at a surface of a semiconductor substrate 112, forming a passivation region over the at least one junction 114, and forming a textured region over the passivation region 116. The passivation region isolates the at least one junction from the textured region, and the semiconductor substrate and the textured region are positioned such that incoming electromagnetic radiation passes through the semiconductor substrate before contacting the textured region. The method also includes coupling an electrical transfer element to the semiconductor substrate 118 such that the electrical transfer element is operable to transfer an electrical signal from the at least one junction. In one aspect, multiple pixels can be associated together to form an imager. A passivation layer can also be disposed on the backside of the photosensitive imager device to protect and/or reduce the dark current of the device.

In another aspect of the present disclosure, a method for making a photosensitive diode is provided. Such a method can include forming at least one cathode and at least one anode on a surface of a semiconductor substrate, depositing a passivation region on the semiconductor substrate over the cathode and the anode, and forming a textured region over the passivation layer. An electrical transfer element can be deposited on the semiconductor substrate and can be electrically coupled to at least one of the anode and cathode to form a photosensitive pixel. In some cases, the electrical transfer element can be electrically isolated from the semiconductor substrate. In another aspect, the semiconductor substrate can be thinned to improve the response rate and/or speed of the device.

Of course, it is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A backside-illuminated photosensitive imager device, comprising:
   a plurality of semiconductor devices including a semiconductor substrate having a light incident side and multiple doped regions forming at least one junction;
   a first textured region associated with the semiconductor substrate and positioned to interact with electromagnetic radiation so as to cause at least a portion of said electromagnetic radiation to experience multiple passes within said semiconductor substrate so as to enhance quantum efficiency of said imager device, wherein the first textured region is positioned such that incoming electromagnetic radiation passes through the semiconductor substrate before contacting the textured region;
a second textured region associated with the light incident side of the semiconductor substrate, wherein the at least one junction is disposed between the first and second textured regions; and
at least one isolation feature operable to isolate the plurality of semiconductor devices from each other.

2. The device of claim 1, wherein the at least one isolation feature is operable to electrically isolate the plurality of semiconductor devices from each other.

3. The device of claim 1, wherein the at least one isolation feature is operable to optically isolate the plurality of semiconductor devices from each other.

4. The device of claim 1, wherein the at least one isolation feature is a deep trench isolation feature.

5. The device of claim 1, wherein the at least one isolation feature is a shallow trench isolation feature.

6. The device of claim 1, wherein the at least one isolation feature includes a material selected from the group consisting of, metals, oxides, polymers, or combinations thereof.

7. The device of claim 1, wherein the at least one isolation feature includes a reflecting material.

8. The device of claim 1, further comprising a reflective layer coupled to the semiconductor substrate and positioned to interact with electromagnetic radiation.

9. The device of claim 8, wherein the reflective layer includes a material selected from the group consisting of metal, oxide, or combinations thereof.

10. The device of claim 8, wherein the reflective layer is a Bragg reflector.

11. The device of claim 1, wherein the semiconductor substrates are epitaxially grown.

12. The device of claim 1, further comprising at least on electrical transfer element functionally coupled to the plurality of semiconductor devices.

13. The device of claim 1, wherein the semiconductor substrates are comprised of silicon.

14. The device of claim 1, wherein the textured region is formed by a technique selected from the group consisting of lasing, chemical etching, anisotropic etching, isotropic etching, nanoimprinting, additional material deposition, and combinations thereof.

15. The device of claim 1, further comprising a passivation region positioned between the first textured region and the at least one junction.

16. The device of claim 15, wherein the passivation region is coupled directly to the at least one junction.

17. The device of claim 1, wherein the first textured region is coupled directly to the substrate adjacent the at least one junction.

* * * * *